(12) United States Patent
Kang et al.

(10) Patent No.: US 11,887,840 B2
(45) Date of Patent: Jan. 30, 2024

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Min Sung Kang, Yongin-si (KR); Hyoung Yol Mun, Yongin-si (KR); Jun U Jin, Asan-si (KR); Bo Hyun Kim, Suwon-si (KR); Sung Dong Cho, Hwaseong-si (KR); Won Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 17/678,392

(22) Filed: Feb. 23, 2022

(65) Prior Publication Data
US 2023/0016186 A1     Jan. 19, 2023

(51) Int. Cl.
*H01L 23/00* (2006.01)

(52) U.S. Cl.
CPC .............. *H01L 24/13* (2013.01); *H01L 24/02* (2013.01); *H01L 2224/0239* (2013.01); *H01L 2224/02311* (2013.01); *H01L 2224/02381* (2013.01); *H01L 2224/13111* (2013.01); *H01L 2224/13124* (2013.01); *H01L 2224/13139* (2013.01);
(Continued)

(58) Field of Classification Search
CPC ..................... H01L 24/02; H01L 24/13; H01L 2224/13184; H01L 2224/13172; H01L 2224/13166; H01L 2224/13147; H01L 2224/13144; H01L 2224/13139; H01L 2224/13124; H01L 2224/13111; H01L 24/0239; H01L 24/02381; H01L 24/02311
See application file for complete search history.

(56) References Cited

U.S. PATENT DOCUMENTS

| 7,952,203 B2 | 5/2011 | Hwang |
| 8,084,169 B2 | 12/2011 | Hamouda |

(Continued)

FOREIGN PATENT DOCUMENTS

| KR | 10-2006-0061527 | 6/2006 |
| TW | 201935642 | 9/2019 |

OTHER PUBLICATIONS

Office Action issued in corresponding Taiwanese Patent Application No. 111125628 dated Apr. 20, 2023.

*Primary Examiner* — Hoa B Trinh
(74) *Attorney, Agent, or Firm* — F. Chau & Associates, LLC

(57) ABSTRACT

A semiconductor device includes a substrate. A conductive layer is disposed on the substrate and extends in a first direction. An insulating layer is disposed on the conductive layer and exposes at least a portion of the conductive layer through a via hole. The via hole includes a first face extending in a first slope relative to a top face of the conductive layer. A second face extends in a second slope relative to the top face of the conductive layer that is less than the first slope. A redistribution conductive layer includes a first pad area disposed in the via hole. A line area at least partially extends along the first face and the second face. The first face directly contacts the conductive layer. The second face is positioned at a higher level than the first face in a second direction perpendicular to a top face of the substrate.

20 Claims, 24 Drawing Sheets

(52) U.S. Cl.
CPC ............... *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13172* (2013.01); *H01L 2224/13184* (2013.01)

(56) References Cited

U.S. PATENT DOCUMENTS

| | | | |
|---|---|---|---|
| 10,847,482 | B2 | 11/2020 | Sugioka et al. |
| 2015/0262948 | A1 | 9/2015 | Lu et al. |
| 2017/0062361 | A1* | 3/2017 | Yajima ..................... H01L 24/49 |
| 2017/0179051 | A1* | 6/2017 | Chen ..................... H01L 24/05 |
| 2018/0240736 | A1* | 8/2018 | Liu ......................... H01L 24/06 |
| 2020/0033736 | A1 | 1/2020 | Bristol et al. |
| 2020/0328168 | A1 | 10/2020 | Roh |
| 2021/0020455 | A1 | 1/2021 | Shih |

\* cited by examiner

10a

SEMICONDUCTOR DEVICE AND METHOD FOR MANUFACTURING THE SAME

CROSS-REFERENCE TO RELATED APPLICATION

This application claims priority under 35 U.S.C. § 119 to Korean Patent Application No. 10-2021-0091904, filed on Jul. 14, 2021 in the Korean Intellectual. Property Office, the disclosure of which is incorporated by reference in its entirety herein.

TECHNICAL FIELD

The present disclosure relates to a semiconductor device and a method far manufacturing the semiconductor device.

DISCUSSION OF RELATED ART

The demand for high-functionality, high-speed, and miniaturization of electronic components is increasing in the electronic industry. Accordingly, semiconductor devices are being manufactured to have an increasingly high integration level. However, as a line in the semiconductor device is narrowed, a redistribution layer is not easily formed on lines.

Due to a high integration level of the semiconductor device, a width of each of a via of a redistribution conductive layer and a metal line below the via are reduced. As the width of the via decreases, deterioration of a step coverage of the via may cause increases in resistance and the occurrence of failures. Further, an overhang phenomenon of the redistribution layer at an entrance of the via hole may occur, thereby causing deterioration of the semiconductor device.

SUMMARY

A technical purpose of embodiments of the present disclosure is a semiconductor device that includes a redistribution conductive layer having increased step coverage performance and thus having a lower resistance value.

A technical purpose of embodiments of the present disclosure is a semiconductor device including a redistribution conductive layer having increased step coverage performance and thus having a lower resistance value due to a via hole structure having a plurality of slopes.

A technical purpose of embodiments of the present disclosure is a method for manufacturing a semiconductor device with increased step coverage performance using a mask pattern including a parasitic pattern, and without adding a separate process.

According to an embodiment of the present disclosure, a semiconductor device includes a substrate. A conductive layer is disposed on the substrate and extends in a first direction. An insulating layer is disposed on the conductive layer and exposes at least a portion of the conductive layer through a via hole defined therein. The via hole includes a first face extending in a first slope relative to a top face of the conductive layer. A second face extends in a second slope relative to the top face of the conductive layer. The second slope is less than the first slope. A redistribution conductive layer includes a first pad area disposed in the via hole. A line area at least partially extends along the first face and the second face. The first face directly contacts the conductive layer, and the second face is positioned at a level higher than a level of the first face in a second direction perpendicular to a top face of the substrate.

According to an embodiment of the present disclosure, a semiconductor device includes a substrate. A conductive layer is disposed on the substrate and extends in a first direction. An insulating layer is disposed on the conductive layer and exposes at least a portion of the conductive layer through a via hole defined therein. The via hole includes a first face extending in a first slope relative to a top face of the conductive layer. A second face extends in a second slope relative to the top face of the conductive layer. The second slope is less than the first slope. A redistribution conductive layer includes a first pad area disposed in the via hole. A line area at least partially extends along the first face and the second face. The line area extends in a slope that is less than a slope of a second direction perpendicular to a top face of the substrate.

According to an embodiment of the present disclosure, a method for manufacturing a semiconductor device includes providing a substrate. A conductive layer is formed on the substrate. An insulating layer is formed on the conductive layer. A photoresist layer is formed on the insulating layer. The photoresist layer is exposed to light using a mask including a pattern group and the exposed photoresist layer is developed to form a photoresist hole pattern. The insulating layer is etched using the photoresist hole pattern as an etching mask to form a via hole defined in the insulating layer. The via hole exposes at least a portion of the conductive layer. A redistribution conductive layer is formed that includes a first pad area disposed in the via hole and a line area that at least partially extends along a sidewall of the via hole. The pattern group includes a main pattern having a same planar shape as a planar shape of the via hole. A plurality of parasitic patterns is arranged sequentially and outwardly to surround the main pattern. Each of the plurality of parasitic patterns has a closed ring shape in a plan view.

Purposes according to the present disclosure are not limited to the above-mentioned purposes. Other purposes and advantages according to the present disclosure that are not mentioned may be understood based on the following descriptions, and may be more clearly understood based on embodiments according to the present disclosure. Further, it will be easily understood that the purposes and advantages according to the present disclosure may be realized using means Shown in the claims and combinations thereof.

BRIEF DESCRIPTION OF DRAWINGS

The above and other aspects and features of the present disclosure will become more apparent by describing in detail embodiments thereof with reference to the attached drawings, in which:

FIG. 12 is an enlarged view of the area Rb of FIG. 11 according to an embodiment of the present disclosure;

DETAILED DESCRIPTION OF EMBODIMENTS

Figure 1:
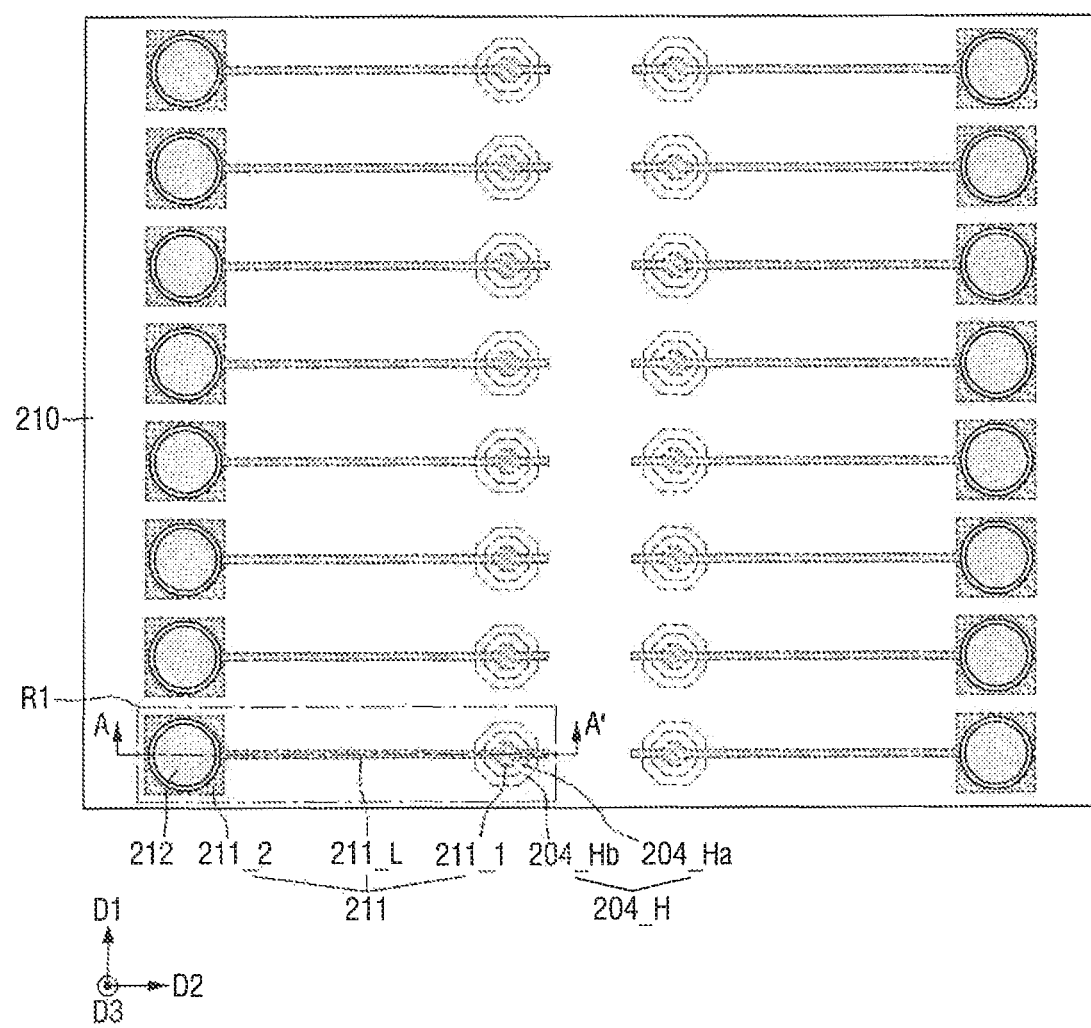
FIG. 1 is a plan view for illustrating a semiconductor device according to an embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements may be omitted for simplicity of the description. Furthermore, in the following detailed description of embodiments of the present disclosure, numerous specific details are set forth to provide a thorough understanding of embodiments of the present disclosure. However, it will be understood that embodiments of the present disclosure may be practiced without these specific details. In other instances, well-known methods, procedures, components, and circuits have not been described in detail so as to not unnecessarily obscure aspects of the present disclosure. Examples of various embodiments are illustrated and described further below. It will be understood that the description herein is not intended to limit the present disclosure to the specific embodiments described. On the contrary, it is intended to cover alternatives, modifications, and equivalents as may be included within the spirit and scope of the present disclosure.

A shape, a size, a ratio, an angle, a number, etc. disclosed in the drawings for describing embodiments of the present disclosure are examples, and the present disclosure is not limited thereto. The same reference numerals refer to the same elements herein. Further, descriptions and details of well-known steps and elements are omitted for simplicity of the description.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of at least one of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with additional element(s) or layer(s) disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still additional layer(s), film(s), region(s), plate(s), or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Terms "first direction D1", "second direction D2" and "third direction D3" as used herein should not be interpreted only to have a geometric relationship in which the first direction, the second direction, and the third direction are perpendicular to each other. The "first direction D1", "second direction D2" and "third direction D3" may be interpreted to have a broader direction within a range in which components herein may work functionally.

Hereinafter, embodiments according to the technical idea of the present disclosure will be described with reference to the accompanying drawings. In descriptions of FIG. 1 to FIG. 24, the same reference numerals are allocated to substantially the same components, and duplicate descriptions of the components are omitted. Further, throughout the various drawings of the present disclosure, like reference numerals are allocated to like elements.

Figure 2:
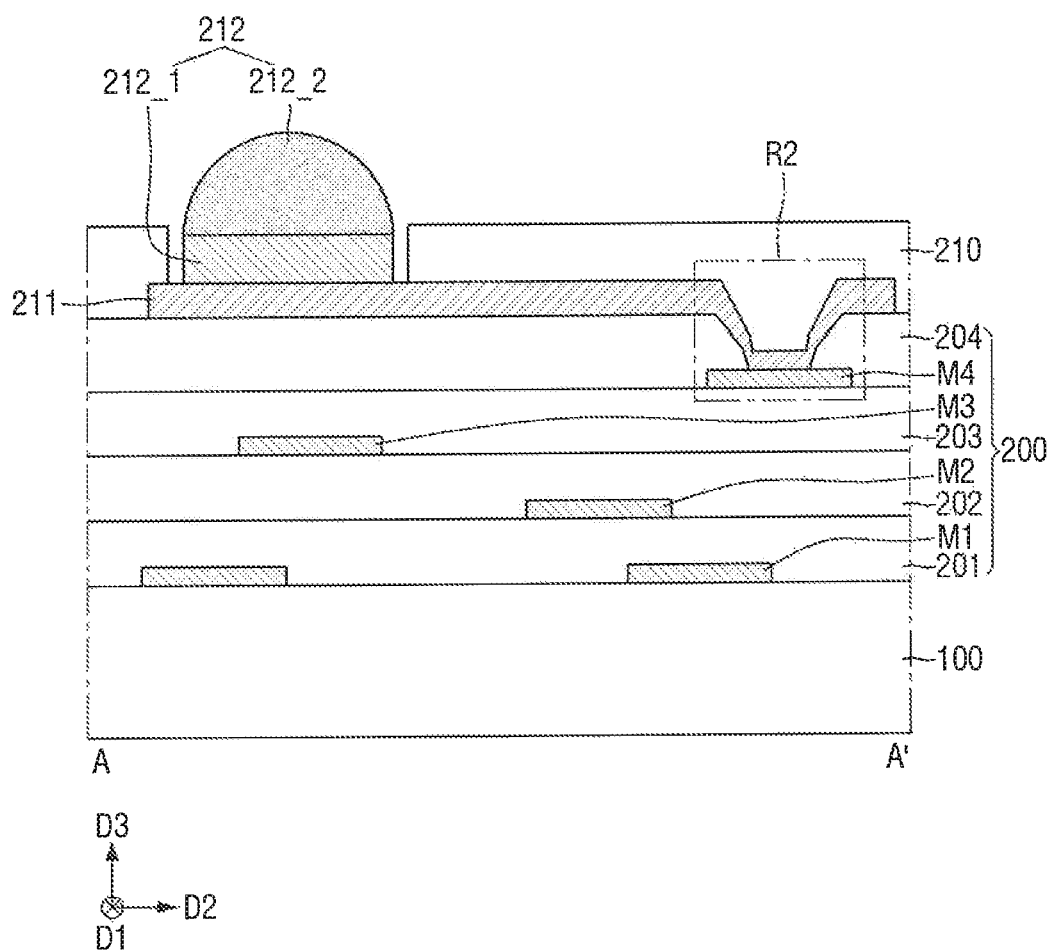
FIG. 2 is a cross-sectional view of the semiconductor device of FIG. 1 taken along a line A-A' of FIG. 1 according to an embodiment of the present disclosure.
Figure 3:
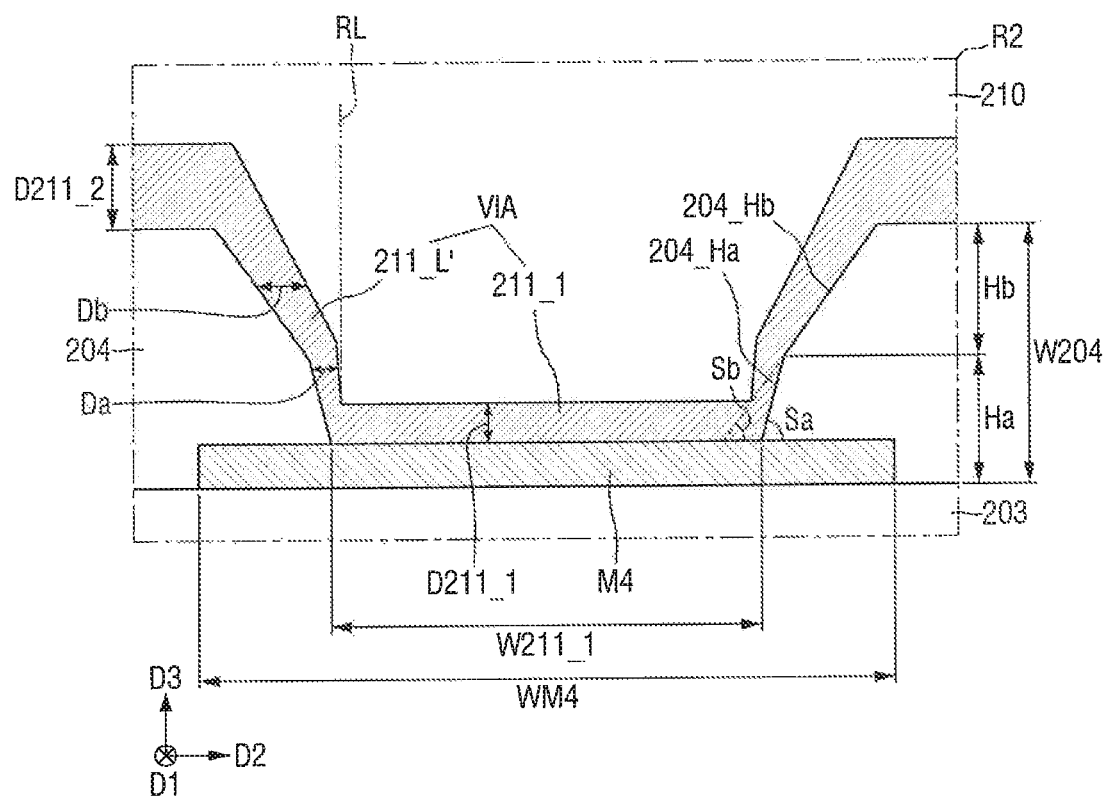
FIG. 3 is an enlarged view of area R2 of FIG. 2 according to an embodiment of the present disclosure.
Figure 4:
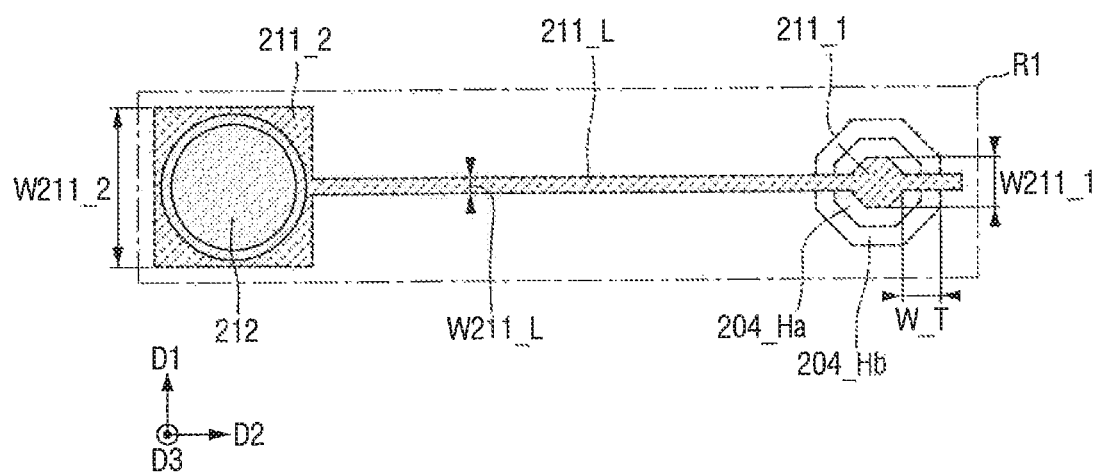
FIG. 4 is an enlarged view of area R1 of FIG. 1 according to an embodiment of the present disclosure.

FIG. 1 is a plan view illustrating a semiconductor device according to an embodiment of the present disclosure. FIG. 2 is a cross-sectional view of the semiconductor device of FIG. 1 taken along a line A-A'. FIG. 3 is an enlarged view of a R2 area of FIG. 2. FIG. 4 is an enlarged view of a R1 area of FIG. 1.

The semiconductor device 10 may be embodied as a memory chip. For example, in an embodiment, the memory chip may include a volatile memory chip such as DRAM (Dynamic Random Access Memory) or SRAM (Static Random Access Memory), or a non-volatile memory chip such as PRAM (Phase-change Random Access Memory), MRAM (Magnetoresistive Random Access Memory), FeRAM (Ferroelectric Random Access Memory) or RRAM (Resistive Random Access Memory). In addition, the memory chip may be embodied as an HBM (High Bandwidth Memo memory chip in which a plurality of DRAM memory chips are stacked. For example, the semiconductor device 10 may be embodied as the HBM memory chip. Alternatively, the semiconductor device 10 may be embodied as, for example, a logic chip. For example, the logic chip may include a CPU (Central Processor Unit), an MPU (Micro Processor Unit), a GPU (Graphic Processor Unit), a controller, or an ASIC (Application Specific Integrated Circuit), or a modem chip. Alternatively, the semiconductor device 10 may be embodied as an AP (Application Processor) used in a mobile phone or a smart phone.

Referring to FIG. 1 to FIG. 4, the semiconductor device 10 according to some embodiments of the present disclosure may include a substrate 100, a wiring layer 200, a passivation layer 210, a redistribution conductive layer 211, and a redistribution bump 212.

In an embodiment, the substrate 100 may be made of bulk silicon or SOI (silicon-on-insulator). Alternatively, the substrate 100 may be embodied as a silicon substrate, or may be made of other materials than silicon, for example, silicon germanium, SGOI (silicon germanium on insulator), indium antimonide, a lead tellurium compound, indium arsenide, indium phosphide, gallium arsenide or gallium antimonide. However, embodiments of the present disclosure are not limited thereto.

In an embodiment, the substrate 100 may include various internal circuit elements. The internal circuit elements may include an active element such as a transistor, or a passive element such as a resistor, a capacitor, or a contact/TSV (Through Silicon Via).

The wiring layer 200 may include first to fourth insulating layers 201 to 204 and first to fourth conductive layers M1 to M4. The first to fourth insulating layers 201 to 204 may be sequentially stacked in a third direction D3. The third direction D3 is normal to the substrate 100.

The first insulating layer 201 may be formed on the substrate 100. In an embodiment shown in FIG. 2, the first insulating layer 201 is shown to be formed directly on the substrate 100. However, this is only for convenience of illustration and embodiments of the present disclosure are not limited thereto. For example, in an embodiment, at least one other interlayer insulating film and/or a conductive pattern may be interposed between the substrate 100 and the first insulating layer 201 (e.g., in the third direction D3).

The first insulating layer 201 may include, for example, a compound selected from silicon oxide, silicon nitride, silicon oxynitride, a low dielectric constant material having a lower dielectric constant than that of the silicon oxide, and combinations thereof. The low dielectric constant material may include, for example, at least one compound selected from FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, and combinations thereof. However, embodiments of the present disclosure are not limited thereto.

The first conductive layer M1 may be formed in the first insulating layer 201. For example, the first conductive layer M1 may extend in a first direction D1 or a second direction D2. The first direction D1 the second direction. D2 may be parallel to a top face of the substrate 100. Accordingly, the first conductive layer M1 may extend in the first insulating layer 201 in an elongate manner. In an embodiment, a via may be formed on the first conductive layer M1 and may be electrically connected to the second conductive layer M2 to be described later.

In an embodiment, the first conductive layer M1 may include a conductive material. For example, the first conductive layer M1 may include a metal such as at least one compound selected from tungsten (W), titanium (Ti), tantalum (Ta), copper (Cu), and aluminum (Al). However, embodiments of the present disclosure are not limited thereto. Hereinafter, for convenience of description, an example in which the first conductive layer M1 includes copper (Cu) is described.

In an embodiment, the first conductive layer M1 may be connected to the various internal circuit elements in the substrate 100. Accordingly, the first conductive layer M1 may be used to constitute a circuit of the semiconductor device 10 according to some embodiments.

The second insulating layer 202 may be formed on the first insulating layer 201 and the first conductive layer M1. For example, as shown in FIG. 2, in an embodiment the second insulating layer 202 may be formed directly on the first insulating layer 201. However, this is only for convenience of illustration and embodiments of the present disclosure are not limited thereto. For example, in an embodiment, an etch stop layer and/or a conductive pattern may be interposed between the second insulating layer 202 and the first insulating layer 201 (e.g., in the third direction D3). A material of the second insulating layer 202 may refer to the description of the first insulating layer 201 as described above.

The second conductive layer M2 may be formed in the second insulating layer 202. For example, the second conductive layer M2 may extend in the first direction D1 or the second direction D2. Accordingly, the second conductive layer M2 may extend in an elongate manner in the second insulating layer 202. In an embodiment, a via may be formed on the second conductive layer M2 and may be electrically connected to the third conductive layer M3 to be described later.

The second conductive layer M2 may include a conductive material. For example, in an embodiment, the second conductive layer M2 may include a metal such as at least one compound selected from tungsten (W), titanium (Ti), tantalum (Ta), copper (Cu), and aluminum (Al). However, embodiments of the present disclosure are not limited thereto. For convenience of description, an example in which the second conductive layer M2 includes copper (Cu) is described.

In an embodiment, the second conductive layer M2 may be connected to the various internal circuit elements in the substrate 100. Accordingly, the second conductive layer M2 may be used to constitute the circuit of the semiconductor device 10 according to some embodiments.

The third insulating layer 203 may be formed on the second insulating layer 202 and the second conductive layer M2. For example, as shown in FIG. 2, in an embodiment the third insulating layer 203 may be formed directly on the second insulating layer 202. However, this is only for convenience of illustration and embodiments of the present disclosure are not limited thereto. For example, in an embodiment, an etch stop layer and/or a conductive pattern may be interposed between the third insulating layer 203 and the second insulating layer 202. In an embodiment, a material of the third insulating layer 203 may be the same as a material of the first insulating layer 201 as described above.

The third conductive layer M3 may be formed in the third insulating layer 203. For example, the third conductive layer M3 may extend in the first direction D1 or the second direction D2. Accordingly, the third conductive layer M3 may extend in an elongate manner in the third insulating layer 203. In an embodiment, a via may be formed on the third conductive layer M3 and may be electrically connected to the fourth conductive layer M4 to be described later.

The third conductive layer M3 may include a conductive material. For example, in an embodiment, the third conductive layer M3 may include a metal such as at least one compound selected from tungsten (W), titanium (Ti), tantalum (Ta), copper (Cu), and aluminum (Al). However, embodiments of the present disclosure are not limited thereto. For convenience of description, an example in which the third conductive layer M3 includes copper (Cu) is described.

In an embodiment, the third conductive layer M3 may be connected to the various internal circuit elements in the substrate 100. Accordingly, the third conductive layer M3 may be used to constitute the circuit of the semiconductor device 10 according to some embodiments.

The fourth insulating layer 204 may be formed on the third insulating layer 203 and the third conductive layer M3. As shown in FIG. 2, in an embodiment, the fourth insulating layer 204 may be formed directly on the third insulating layer 203. However, this is only for convenience of description and embodiments of the present disclosure are not limited thereto. For example, in an embodiment, an etch stop layer and/or a conductive pattern may be interposed between the fourth insulating layer 204 and the third insulating layer 203 (e.g., in the third direction D3). In an embodiment, a material of the fourth insulating layer 204 may be a same material as the material of the first insulating layer 201 as described above.

The fourth conductive layer M4 may be formed in the fourth insulating layer 204. For example, the fourth conductive layer M4 may extend in the first direction D1. In an embodiment, a width WM4 in the second direction D2 of the fourth conductive layer M4 may be in a range of 7 um to 110 um. For example, in an embodiment, the width WM4 in the second direction 172 of the fourth conductive layer M4 may be in a range of 7 um to 17 μm. However, embodiments of the present disclosure are not limited thereto.

The fourth conductive layer M4 may include a conductive material. For example, in an embodiment, the fourth conductive layer M4 may include a metal such as at least one compound selected from tungsten (W), titanium (Ti), tantalum (Ta), copper (Cu), and aluminum (Al). However, embodiments of the present disclosure are not limited thereto. For convenience of description, an example in which the fourth conductive layer M4 includes aluminum (Al) is described.

The fourth insulating layer 204 includes a via hole 204_H exposing at least a portion of the fourth conductive layer M4.

In an embodiment, the via hole 204_H may have a circle shape or a polygonal shape including an octagon in a plan view (e.g., in a plane defined in the first and second directions D1, D2). The shape of the via hole 204_H may be similar to a shape of a first pad area 211_1 as will be described later.

In an embodiment, the via hole 204_H may be formed to be inclined with respect to the third direction D3. The via hole 204_H may include a first face 204_Ha and a second face 204_Hb that are vertically and sequentially arranged with respect to the substrate 100. For example, a lower surface of the second face 204_Hb may directly contact an upper surface of the first face 204_Ha and the second face 204_Hb may be positioned at a level (e.g., distance from the substrate 100 in the third direction D3) that is higher than a level of the first face 204_Ha.

In an embodiment, the first face 204_Ha directly contacts and is connected to a top face of the fourth conductive layer M4, and extends so as to have a first slope Sa relative to the top face of the fourth conductive layer M4. In an embodiment, the first slope Sa is in a range of 60° to 90°. However, embodiments of the present disclosure are not limited thereto.

The second face 204_Hb may be directly connected to and directly contacts the first face 204_Ha, and extends so as to have a second slope Sb relative to the top face of the fourth conductive layer M4. The second slope Sb has a slope that is less than the first slope Sa relative to the top face of the fourth conductive layer M4.

In an embodiment, a thickness W204 in the third direction D3 of the fourth insulating layer 204 including the via hole 204_H is in a range of 2 um to 10 m. In an embodiment, a first vertical dimension Ha of the first face 204_Ha in the third direction D3 is in a range of 1 um to 9 um, and a second vertical dimension Hb of the second face 204_Hb in the third direction D3 is in a range of 1 um to 9 um.

A width W_H in the second direction D2 of each of the first and second faces 204_Ha and 204_Hb is within a range of 0.5 um to 20 um.

In an embodiment, the redistribution conductive layer 211 may include a conductive material such as a compound selected from aluminum (Al), copper (Cu), silver (Ag), tin (Sn), gold (Au), nickel (Ni), lead (Pb), titanium (Ti), or an alloy thereof. In an embodiment, a physical vapor deposition scheme (PVD), a chemical vapor deposition scheme (CVD), a plasma enhanced CND scheme, or an atomic layer deposition scheme (damascene), an electroplating method, etc. may be used to form the redistribution conductive layer 211. For example, in an embodiment, the redistribution conductive layer 211 may be formed using a sputtering scheme that is a type of physical vapor deposition (PVD). However, embodiment of the present disclosure are not limited to the above examples.

The redistribution conductive layer 211 may be electrically connected to and contact the via hole 204_H received in the fourth insulating layer 204. The redistribution conductive layer 211 and the fourth conductive layer M4 directly contact the via hole 204_H formed in the fourth insulating layer 204 and thus are electrically connected to each other via the via hole 204_H received in the fourth insulating layer 204.

In an embodiment, the redistribution conductive layer 211 may include the first pad area 211_1, a second pad area 211_2, and a fine area 211_L. The first pad area 211_1 may be disposed in the via hole 204_H, and may have a circle shape or a polygonal shape including an octagon in a plan view (e.g., in a plane defined in the first and second directions D1, D2). Further, in an embodiment, the first pad area 211_1 is electrically connected to and directly contacts the top face of the fourth conductive layer M4. In an embodiment, a width W211_1 in the first direction D1 or the second direction D2 of the first pad area 211_1 is in a range of 1 um to 100 um.

In an embodiment, a thickness D211_1 in the third direction D3 of the first pad area 211_1 is in a range of 0.3 um to 10 um range.

The second pad area 211_2 may be disposed along and on a top face of the fourth insulating layer 204. In an embodiment, in the plan view, the second pad area 211_2 may have a polygonal shape including a square or a circle shape. However, embodiments of the present disclosure are not limited thereto. In an embodiment, a width W211_2 in the first direction D1 or the second direction D2 of the second pad area 211_2 is greater than the width W211_1 in the first direction D1 or the second direction D2 of the first pad area 211_1.

In an embodiment, a thickness D211_2 in the third direction D3 of the second pad area 211_2 is greater than the thickness D211_1 in the third direction D3 of the first pad area 211_1, and is in a range of 1 um to 10 um.

The line area 211_L extends between the first pad area 211_1 and the second pad area 211_2. A sidewall area 211_L' of the line area 211_L, extends at a slope that is less than the third direction D3 and extends at least partially along the first face 204_Ha and the second face 204_Gb of the via hole 204_H. The sidewall area 211_L' of the line area 211_L is positioned so that it does not extend beyond a limit line RL extending from an outer edge of the first pad area 211_1 in the third direction D3. The sidewall area 211_L' of the line area 211_L and the first pad area 211_1 constitute a via structure VIA.

In an embodiment, a width W211_L, of the line area 211_L is in a range of 0.5 um to 100 um range. For example, in an embodiment, a width W211_L of the line area 211_L is in a range of 0.5 um to 2 um range. In an embodiment, a first thickness Da in the second direction D2 of a portion of the sidewall area 211_L' on a first face 204_Ha is in a range of 0.3 um to 3 um, while a second thickness Db in the second direction D2 of a portion of the sidewall area 211_L' on the second face 204_Hb is in a range of 0.3 um to 10 um. For example, the second thickness Db may be greater than the first thickness Da.

A passivation layer 210 may cover the fourth insulating layer 204 and the redistribution conductive layer 211 and may expose at least a portion of the second pad area 2112 of the redistribution conductive layer 211.

The redistribution bump 212 is in direct contact with a top face of the second pad area 211_2. The redistribution bump 212 and the second pad area 211_2 are electrically connected to the fourth conductive layer M4 via the redistribution conductive layer 211.

In an embodiment, the redistribution bump 212 may include a redistribution under bump metallization ("UBM") 212_1, and a redistribution paste 212_2. In an embodiment, the redistribution UBM 212_1 serves as an adhesive layer, a diffusion prevention layer, and a wetting layer, and may be partially exposed through the passivation layer 210. In an embodiment, the redistribution UBM 212_1 may be composed of a Cr/Cr—Cu/Cu, TiW/Cu, Al/NiV/Cu, Ti/Cu, Ti/Ni, Ni/Au, Ti/Cu/Ni, or Ti/Ni/Cu stack structure. However, embodiments of the present disclosure are not limited thereto. The redistribution UBM 212_1 may be used, for example, as a seed layer in a subsequent plating process. In an embodiment, the redistribution UBM 212_1 may have a circular shape or a polygonal shape, for example, an octagonal shape, in a plan view. In an embodiment, a planar shape of the redistribution paste 212_2 may be identical with an example of the planar shape of the redistribution UBM 212_1.

In an embodiment, the redistribution paste 212_2 may act as a conductive paste and may be, for example, a solder paste or a metal paste. In an embodiment, the redistribution paste 212_2 may include, for example, a tin-silver (Sn—Ag) alloy or tin (Sn). However, embodiments of the present disclosure are not limited thereto.

In the semiconductor device 10 according to some embodiments, the via hole 204_H and the redistribution conductive layer 211 may prevent a low step coverage of the sidewall area 211_L' due to a decrease in a contact area of the pad area 211_1 with the conductive layer M4.

In the semiconductor device 10 according to soiree embodiments, the via hole 204_H and the redistribution conductive layer 211 may prevent formation of an overhang structure of the sidewall area 211_L' due to the decrease in the contact area of the pad area 211_1 with the conductive layer M4.

When the sidewall area 211_L' has the overhang structure, the sidewall area 211_L' is formed along the first face 204_Ha and the second face 204_Hb of the via hole 204_H such that Db is larger such that a portion corresponding to Db extends inwardly beyond the limit line RL, while Da is smaller such that a portion corresponding to Da does not extend inwardly beyond the limit line RL. Thus, the sidewall area 211_L' may intersect the limit line RL extending from the outer edge of the first pad area 211_1 in the third direction D3. When a size of the overhang is larger, a void may be formed between the sidewall area 211_L' and the first pad area 211_1, thereby causing deterioration of the semiconductor device 10.

FIG. 5 to FIG. 18 are diagrams for illustrating intermediate steps of a method for manufacturing a semiconductor device according to some embodiments of the present disclosure.

Figure 5:
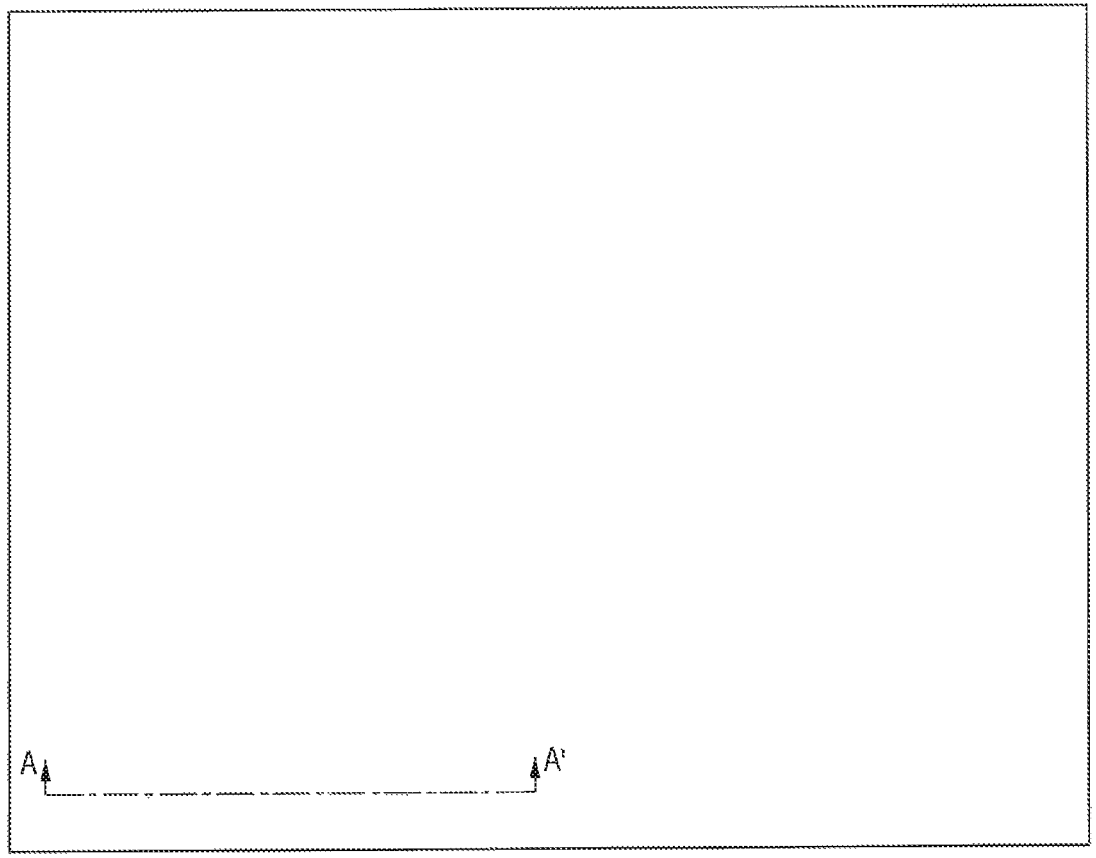
FIGS. 5, 7, 10, 13, 15 and 17 are plan views illustrating intermediate steps of a method for manufacturing a semiconductor device according to embodiments of the present disclosure.
Figure 5:
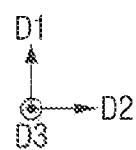
Figure 6:
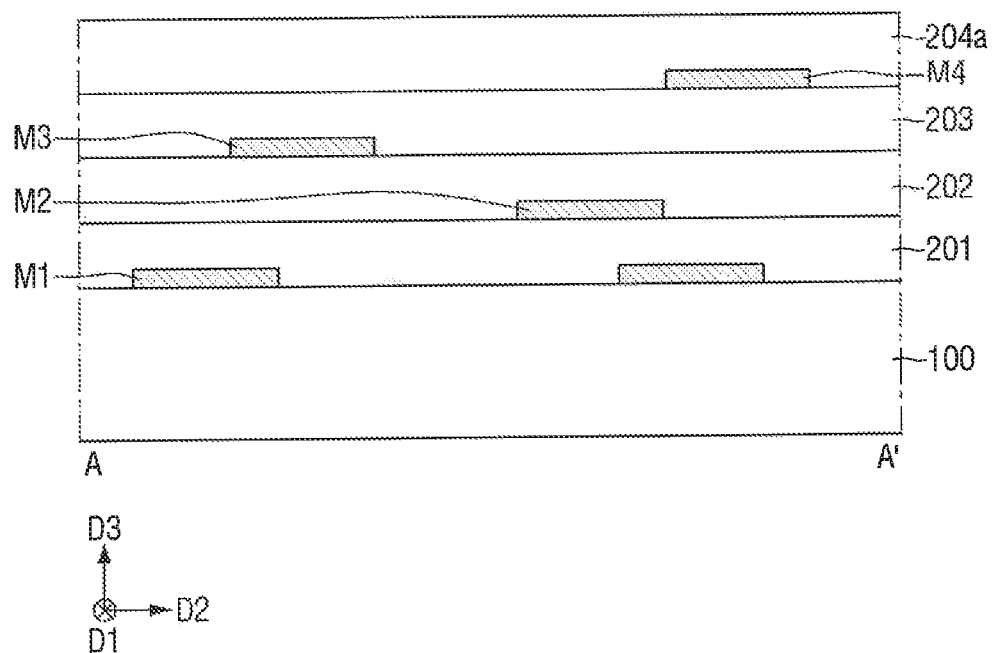
FIGS. 6, 8, 11, 12, 14, 16 and 18 are cross-sectional views taken along lines A-A' of FIGS. 5, 7, 10, 13, 15 and 17, respectively, illustrating intermediate steps of a method for manufacturing a semiconductor device according to embodiments of the present disclosure.

FIG. 6 is a cross-sectional view of a semiconductor device 10a of FIG. 5 taken along a line A-A'. Referring to FIG. 5 and FIG. 6, a fourth pre-insulating layer 204a covering the first to fourth conductive layers M1 to M4 and the first to third insulating layers 201 to 203 on the substrate 100 is provided.

The first to fourth conductive layers M1 to M4 in FIG. 6 correspond to the first to fourth conductive layers M1 to M4 in FIG. 1 to FIG. 4, respectively. The first to third insulating layers 201 to 203 in FIG. 6 correspond to the first to third insulating layers 201 to 203 in FIG. 1 to FIG. 4, respectively. The fourth pre-insulating layer 204a corresponds to the fourth insulating layer 204 in FIG. 1 to FIG. 4. The fourth pre-insulating layer 204a is formed to cover the third insulating layer 203 and the fourth conductive layer M4.

Figure 7:
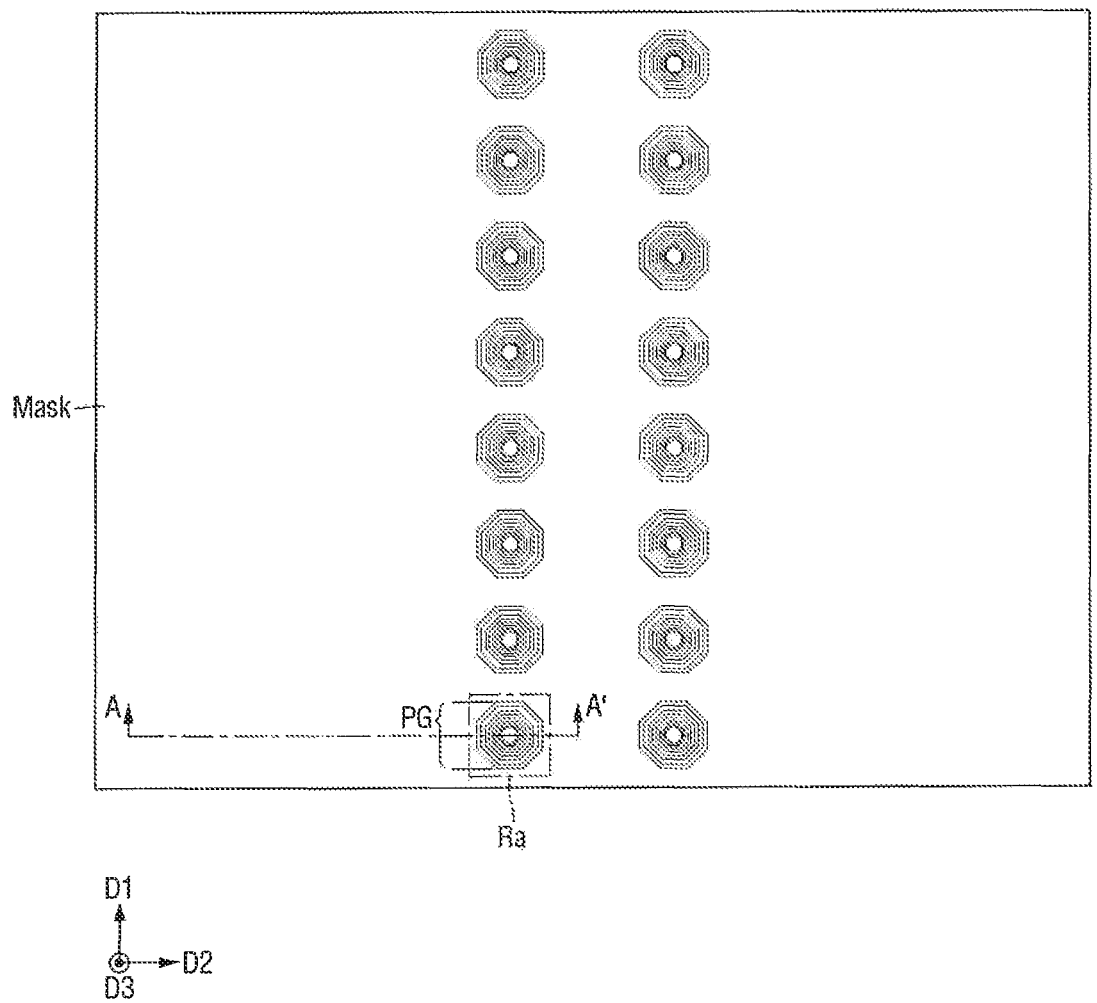
Figure 8:
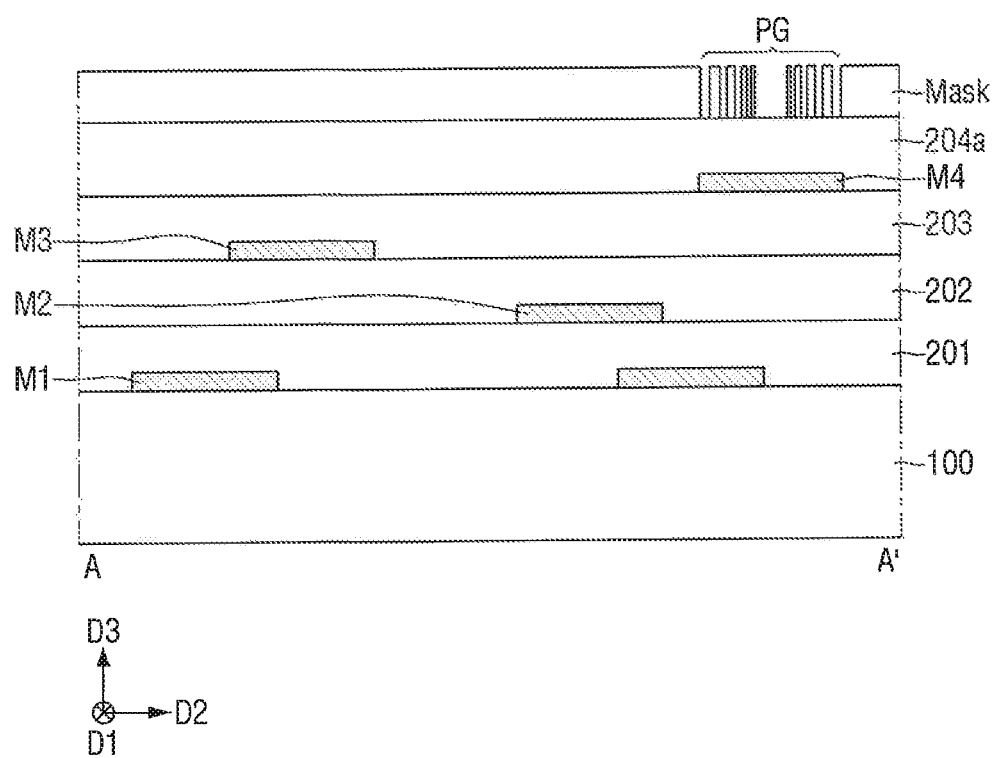
Figure 9:
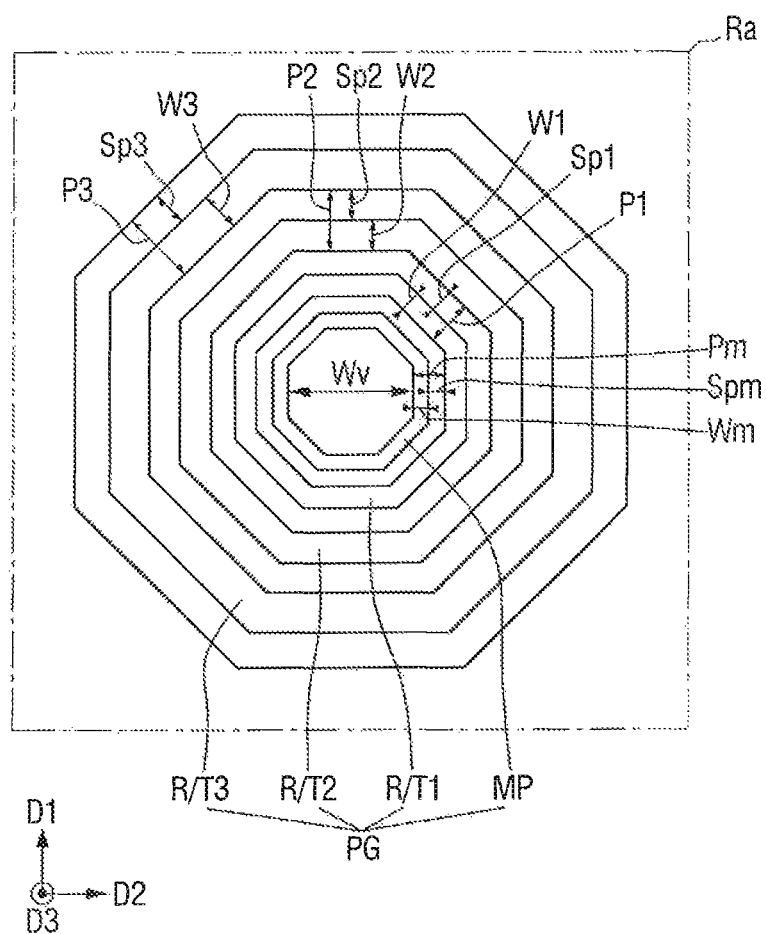
FIG. 9 is an enlarged view of the area Ra of FIG. 7 according to an embodiment of the present disclosure.

FIG. 8 is a cross-sectional view of a semiconductor device 10a of FIG. 7 taken along the line A-A'. FIG. 9 is an enlarged view of the area Ra of FIG. 7. Referring additionally to FIG. 7 to FIG. 9, a photoresist PR may be applied to a top face of the fourth pre-insulating layer 204a, and a mask pattern mask including a pattern group PG is formed on a top face of the photoresist PR.

In an embodiment, the pattern group PG includes a main pattern MP, and first to third parasitic patterns R/T1 to R/T3. The pattern group PG refers to a plurality of mask patterns for forming the via hole 204_H of FIG. 1 to FIG. 4. Although three parasitic patterns are shown in FIG. 9, embodiments of the present disclosure are not limited thereto and the number of the parasitic patterns may vary. In an embodiment, the number of faces of the via hole 204_H may be controlled by adjusting the number of parasitic patterns.

In an embodiment, the main pattern MP has an octagonal shape in a plan view that is identical with that of the fourth via hole 204_H in FIG. 1 to FIG. 4, and has a closed ring shape. In an embodiment, a width Wv in the first direction D1 or the second direction D2 of the octagon excluding the main pattern MP is in a range of 1 um to 100 um.

In a plan view, the main pattern MP may be spaced apart from the first parasitic pattern R/T1 to be described in further detail herein by a main spacing Spm. A main pitch Pm is equal to a sum of a main width Wm of the main pattern MP and the main spacing Spm.

In an embodiment, the first parasitic pattern R/T1 has an octagonal shape in a plan view that is identical with that of the main pattern MP. The first parasitic pattern R/T1 is disposed adjacent to the main pattern MP and has a closed ring shape surrounding the main pattern MP. In a plan view, the first parasitic pattern R/T1 may be spaced apart from the second parasitic pattern R/T2 to be described later by a first spacing Sp1. A first pitch P1 is equal to a sum of a first width W1 of the first parasitic pattern R/T1 and the first spacing Sp1.

In the pattern group PG according to some embodiments, the first spacing Sp1 may be equal to the main spacing Spm or may be different therefrom. In an embodiment, the first width W1 is larger than the main width Wm, so that a ratio of the first spacing Sp1 to the first pitch P1 is less than a ratio of the main spacing Spm to the main pitch Pm.

In an embodiment, the second parasitic pattern R/T2 has an octagonal shape in a plan view that is identical with that of the first parasitic pattern R/T1, and is disposed adjacent to the first parasitic pattern R/T1. The second parasitic pattern R/T2 has a closed ring shape surrounding the first parasitic pattern R/T1. In a plan view, the second parasitic pattern R/T2 may be spaced apart from the third parasitic pattern R/T3 to be described later by a second spacing Sp2. A second pitch P2 is equal to a sum of a second width W2 of the second parasitic pattern R/T2 and the second spacing Sp2.

In the pattern group PG according to some embodiments, the second spacing Sp2 may be equal to the first spacing Sp1, or may be different therefrom. In an embodiment, the second width W2 is larger than the first width W1, so that a ratio of the second spacing Sp2 to the second pitch P2 is less than a ratio of the first spacing Sp1 to the first pitch P1.

In an embodiment, the third parasitic pattern R/T3 has an octagonal shape in a plan view that is identical with that of the second parasitic pattern R/T2. The third parasitic pattern R/T3 is disposed adjacent to the second parasitic pattern R/T2 and has a closed ring shape surrounding the second parasitic pattern R/T2. In a plan view, the third parasitic pattern R/T3 may be spaced apart from the mask layer by a third spacing Sp3. A third pitch P3 is equal to a sum of the third spacing Sp3 and a third width W3 of the third parasitic pattern R/T3.

In the pattern group PG according to some embodiments, the third spacing Sp3 may be equal to the first spacing Sp3, or may be different therefrom. In an embodiment, the third width W3 is larger than the second width W2, so that a ratio of the third spacing Sp3 to the third pitch P3 is Less than a ratio of the second spacing Sp2 to the second pitch P2.

When performing a process based on the decrease in the ratio of the spacing to the pitch of the parasitic pattern, the via hole 204_H in FIG. 1 to FIG. 4 may include the second face 204_Hb having the second slope Sb that is less than the first slope Sa.

In addition, each of the main pattern MP, and the first to third parasitic patterns R/T1 to R/T3 has the octagonal closed ring in the plan view. However, embodiments of the present disclosure are not limited thereto and the shape of each of the first to third parasitic patterns R/T1 to R/T3 may vary, such as according to the planar shape of the via hole 204_H. For example, in an embodiment in which the via hole 204_H has a circular shape in a plan view, each of the main pattern MP, and the first to third parasitic patterns R/T1 to R/T3 has a circular closed ring shape in a plan view.

Figure 10:
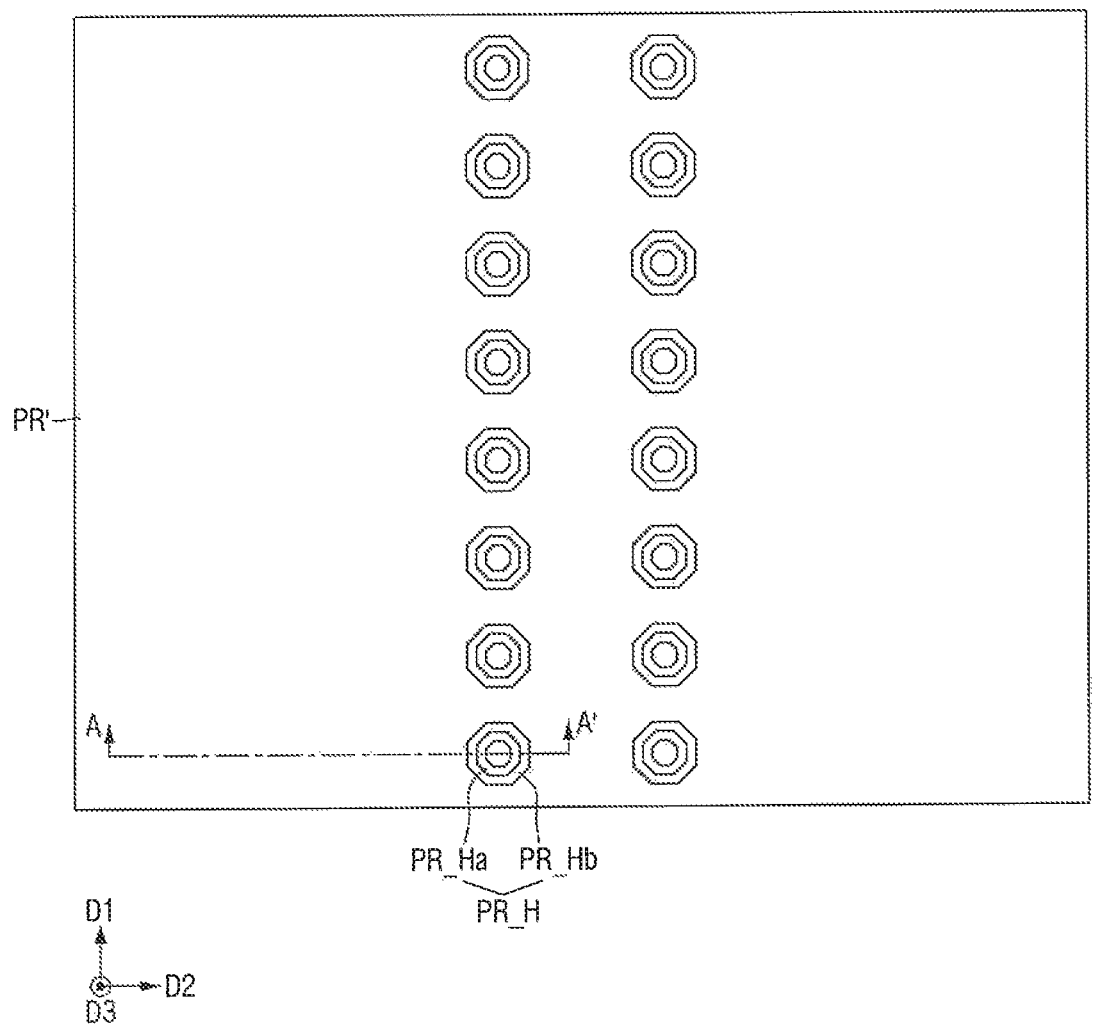
Figure 11:
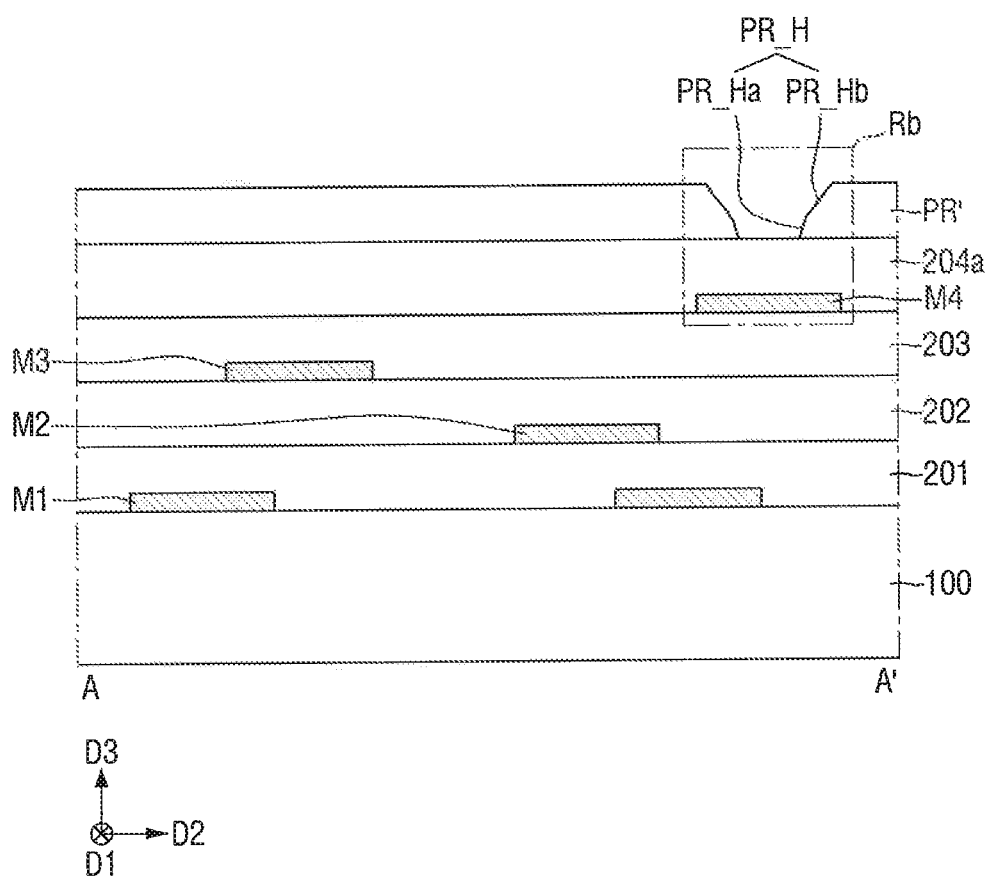
Figure 12:
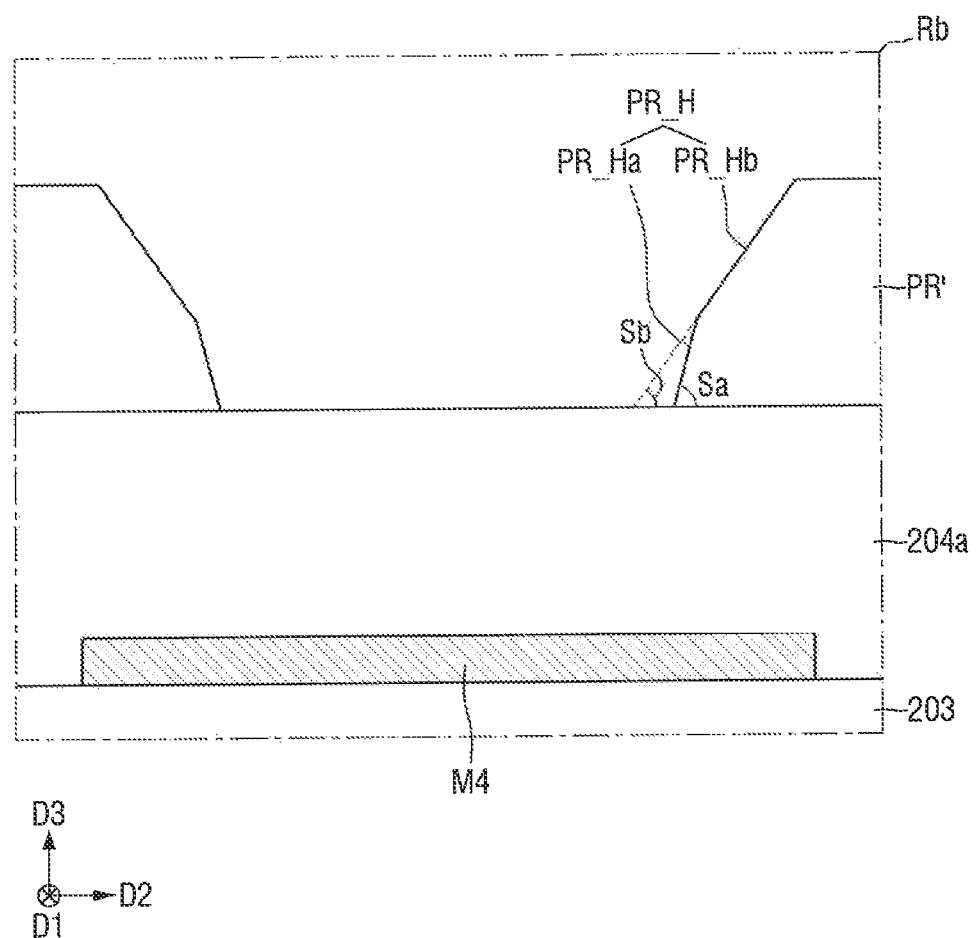

FIG. 11 is a cross-sectional view of a semiconductor device 10a of FIG. 10 taken along the line A-A' of FIG. 10. FIG. 12 is an enlarged view of the Rb area of FIG. 11. Referring additionally to FIG. 10 to FIG. 12, the photoresist PR is exposed to light using the mask pattern Mask (FIG. 8) such that the exposed photoresist is formed. The mask pattern Mask is removed and the exposed photoresist is developed to form a photoresist layer PR' including a photoresist hole pattern PR_H. In an embodiment, the exposure scheme may include contact, proximity projection, projection transfer, immersion, and the like. However, embodiments of the present disclosure are not limited thereto.

The photoresist hole pattern may be formed to be inclined with respect to the third direction D3. The photoresist hole pattern PR_H may include a first face PR_Ha and a second face PR_Hb vertically and sequentially arranged with respect to the substrate 100.

In an embodiment, the first face PR_Ha directly contacts and is connected to a top face of the fourth pre-insulating layer 204a, and extends in a first slope Sa' relative to the top face of the fourth pre-insulating layer 204a. In an embodiment, the first slope Sa' is in a range of 60' to 90°. However, embodiments of the present disclosure are not limited thereto and the numerical value of the first slope Sa' may vary.

The second face PR_Hb is directly connected to and directly contacts the first face PR_Ha, and extends in a second slope Sb' relative to the top face of the fourth pre-insulating layer 204a. In an embodiment, the second slope Sb' is less than the first slope Sa' relative to the top face of the fourth pre-insulating layer 204a. The first slope Sa' and the second slope Sb' may be adjusted by changing a combination of the main width Wm/the first to third widths W1 to W3, the main spacing Spm/the first to third spacings Sp1 to Sp3 and the main pitch Pm/the first to third pitches P1 to P3.

Figure 13:
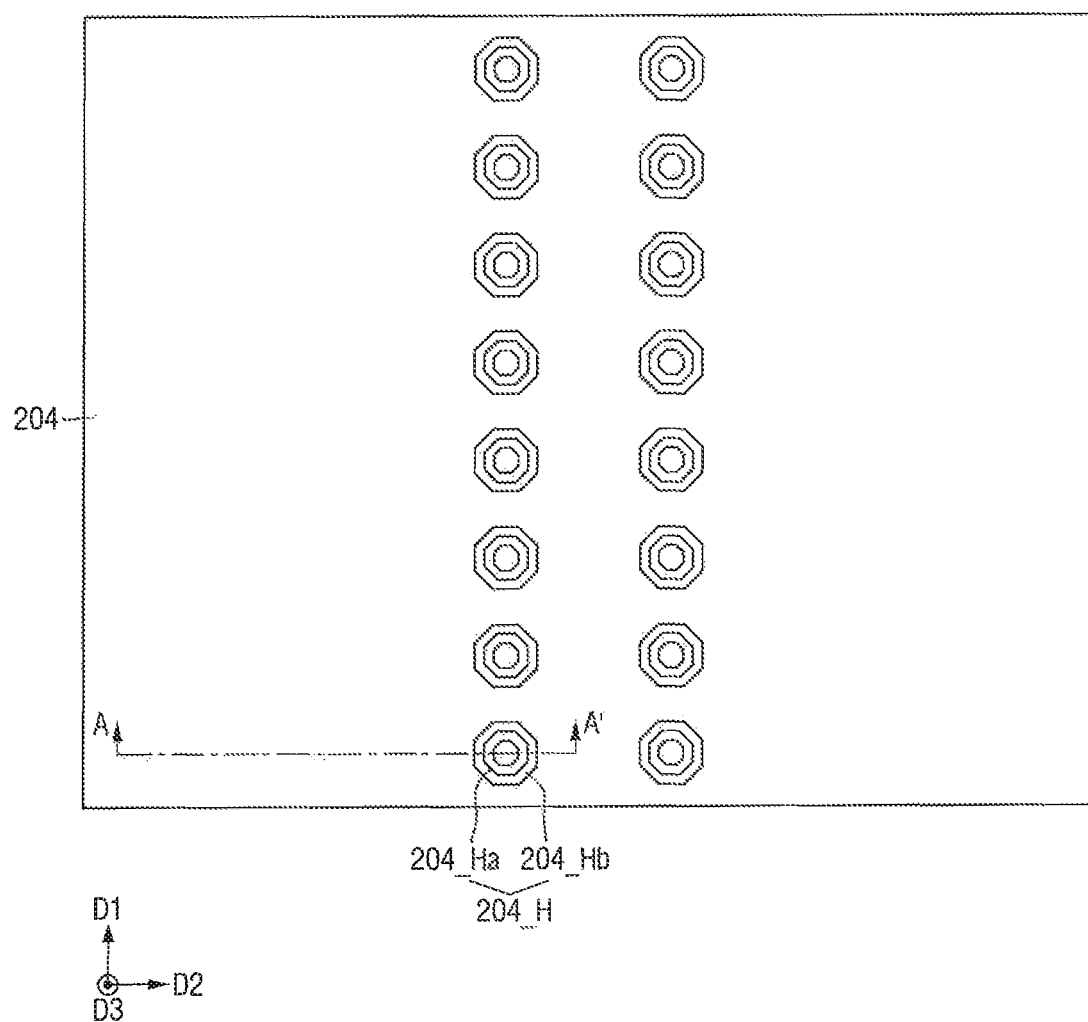
Figure 14:
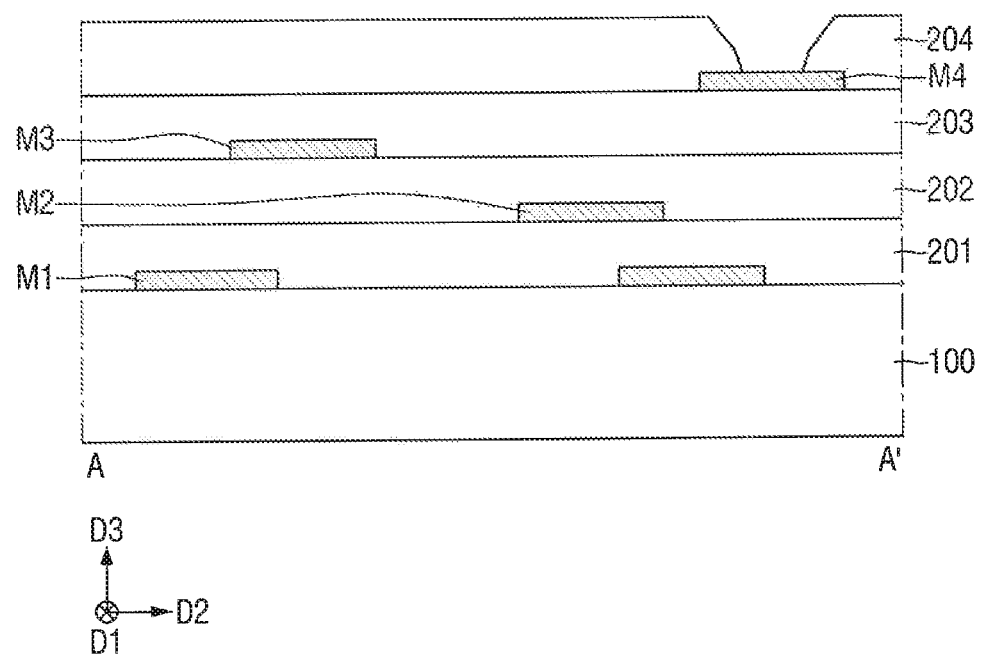

FIG. 14 is a cross-sectional view of a semiconductor device of FIG. 13 taken along the line A-A'. Referring additionally to FIG. 13 and FIG. 14, the fourth pre-insulating layer 204a is etched using the photoresist layer PR' including the photoresist hole pattern PR_H as an etching mask, such that the fourth insulating layer 204 including the via hole 204_14 is formed. A portion of the fourth conductive layer M4 is exposed through the via hole 204_H.

In an embodiment, during the etching process, a laser drilling scheme, a wet etching scheme, or a dry etching scheme may be used. For example, in an embodiment, the dry etching scheme may be used. However, embodiments of the present disclosure are not limited thereto. In an embodiment, the dry etching scheme may include RIE (reactive ion etching), MERIE (magnetically enhanced reactive ion etching), CDE (chemical downstream etching), ECR (electron cyclotron resonance), and TCP (transformer coupled plasma).

Figure 15:
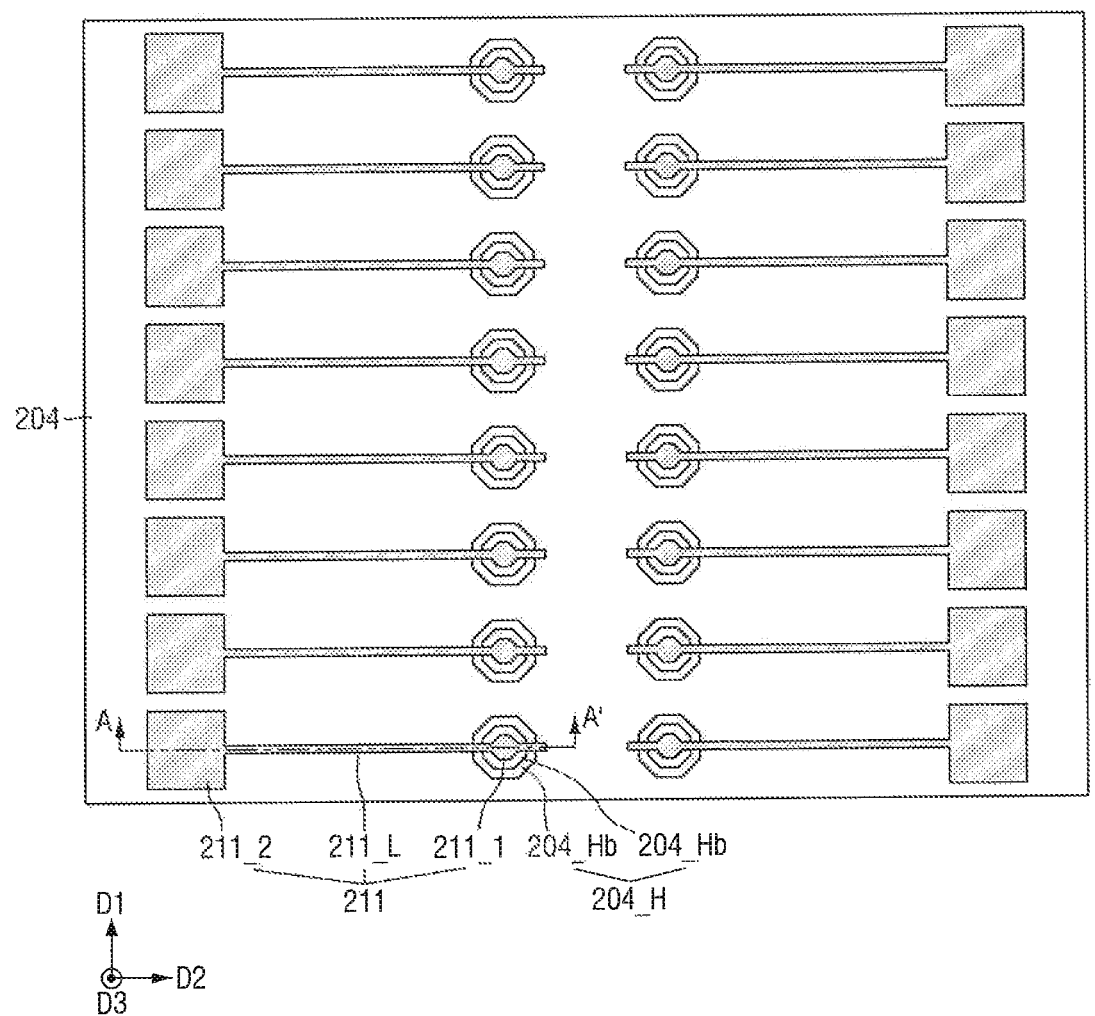
Figure 16:
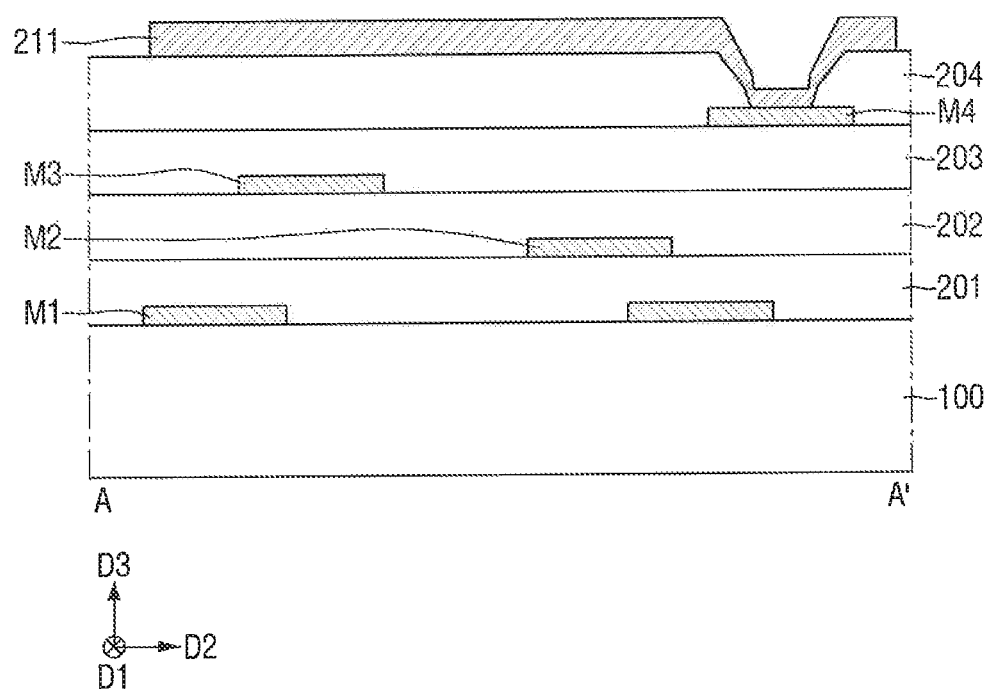

FIG. 16 is a cross-sectional view of a semiconductor device of FIG. 15 taken along the line A-A'. Referring additionally to FIG. 15 and FIG. 16, the redistribution conductive layer 211 is formed on the fourth insulating layer 204 and the via hole 204_H.

In an embodiment, the redistribution conductive layer 211 may include a conductive material such as a compound selected from aluminum (Al), copper (Cu), silver (Ag), tin (Sn), gold (Au), nickel (Ni), lead (Pb), titanium (Ti), or an alloy thereof. In an embodiment, the redistribution conductive layer 211 may be formed using a physical vapor deposition scheme (PVD), an aluminum reflow process accompanied by a physical vapor deposition scheme, a chemical vapor deposition scheme (CVD), a plasma enhanced CVD scheme, an atomic layer deposition scheme (damascene), or an electroplating scheme, etc. For example, the redistribution conductive layer 211 may be formed using a sputtering scheme that is a type of physical vapor deposition (PVD). However, embodiments of the present disclosure are not limited thereto.

Figure 17:
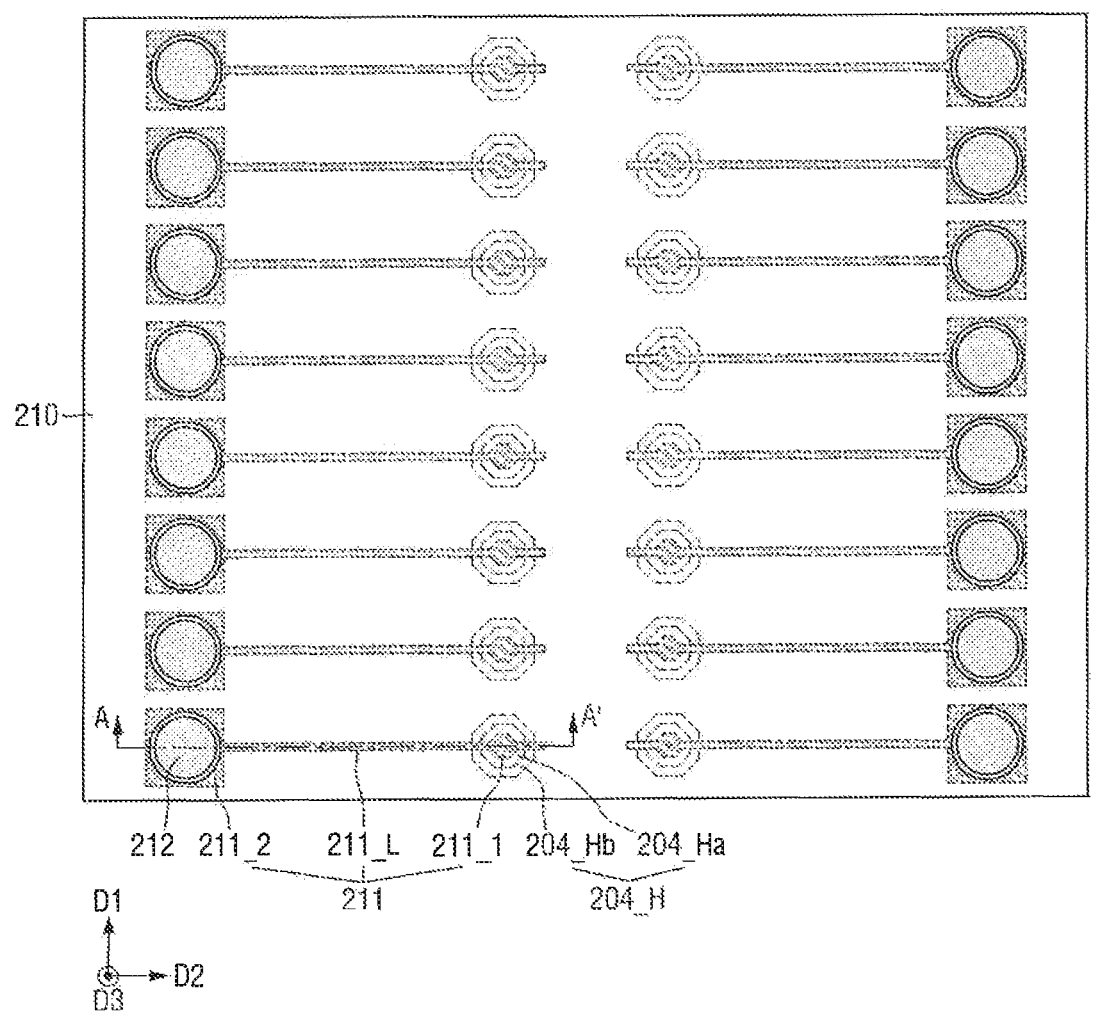
Figure 18:
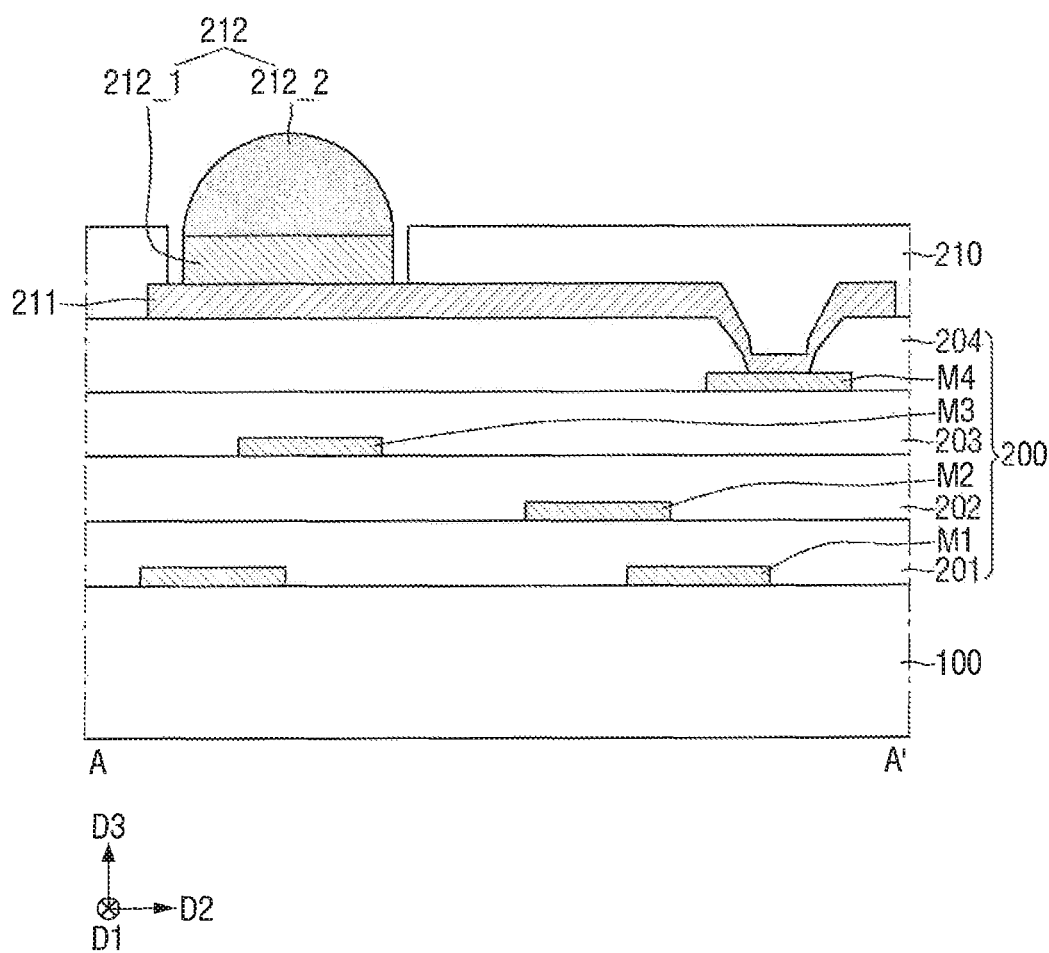

FIG. 18 is a cross-sectional view of a semiconductor device of FIG. 17 taken along the line A-A'. Referring additionally to FIG. 17 and FIG. 18, the passivation layer 210 and the redistribution bump 212 are formed on the redistribution conductive layer 211. Thus, a semiconductor device 10 is formed.

In the method for manufacturing the semiconductor device 10 of FIG. 5 to FIG. 18, the plurality of parasitic patterns R/T1 to R/T3 adjacent to the main pattern MP are included in the mask pattern Mask and then the via hole 204_H and the sidewall area 211_L' of the line area 211_L, in FIG. 1 to FIG. 4 are formed without an additional process. Thus, the step coverage of the redistribution conductive layer 211 may be increased.

Figure 19:
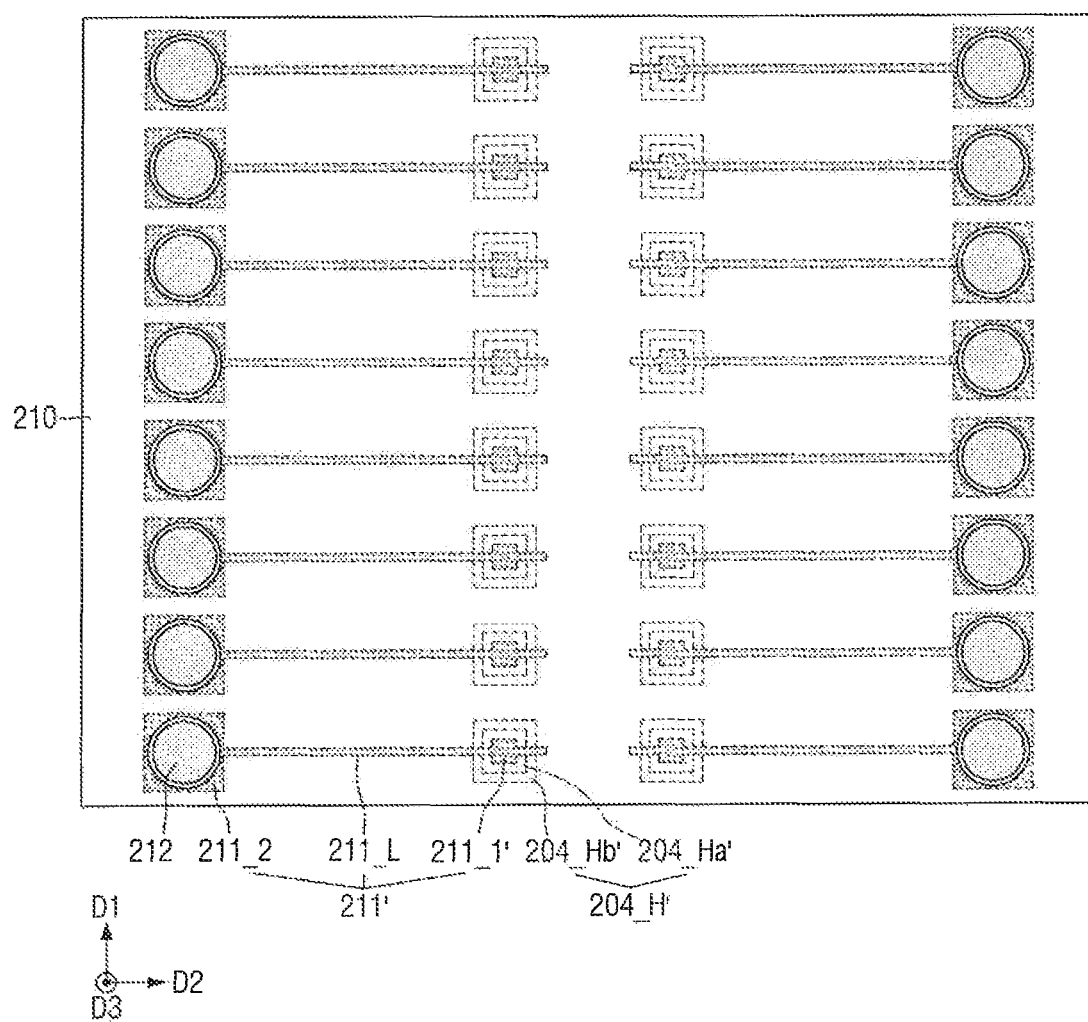
FIG. 19 is a plan view illustrating a semiconductor device according to an embodiment of the present disclosure.

FIG. 19 is a diagram for illustrating a semiconductor device 10' according to an embodiment of the present disclosure. For convenience of description, referring to FIG. 19, the following descriptions are based on differences thereof from those described in FIG. 1 to FIG. 4 and a repeated description of similar or identical elements may be omitted for convenience of explanation.

Referring to FIG. 19, the via hole 204_H in FIG. 1 to FIG. 4 and a via hole 204_H' in FIG. 19 correspond to each other. The redistribution conductive layer 211 of FIG. 1 to FIG. 4 and a redistribution conductive layer 211' of FIG. 19 correspond to each other.

The via hole 204_H' has a rectangular shape in a plan view, and a first pad area 211_1' of the redistribution conductive layer 211' has a rectangular shape in a plan view and is formed in the via hole 204_H'.

Figure 20:
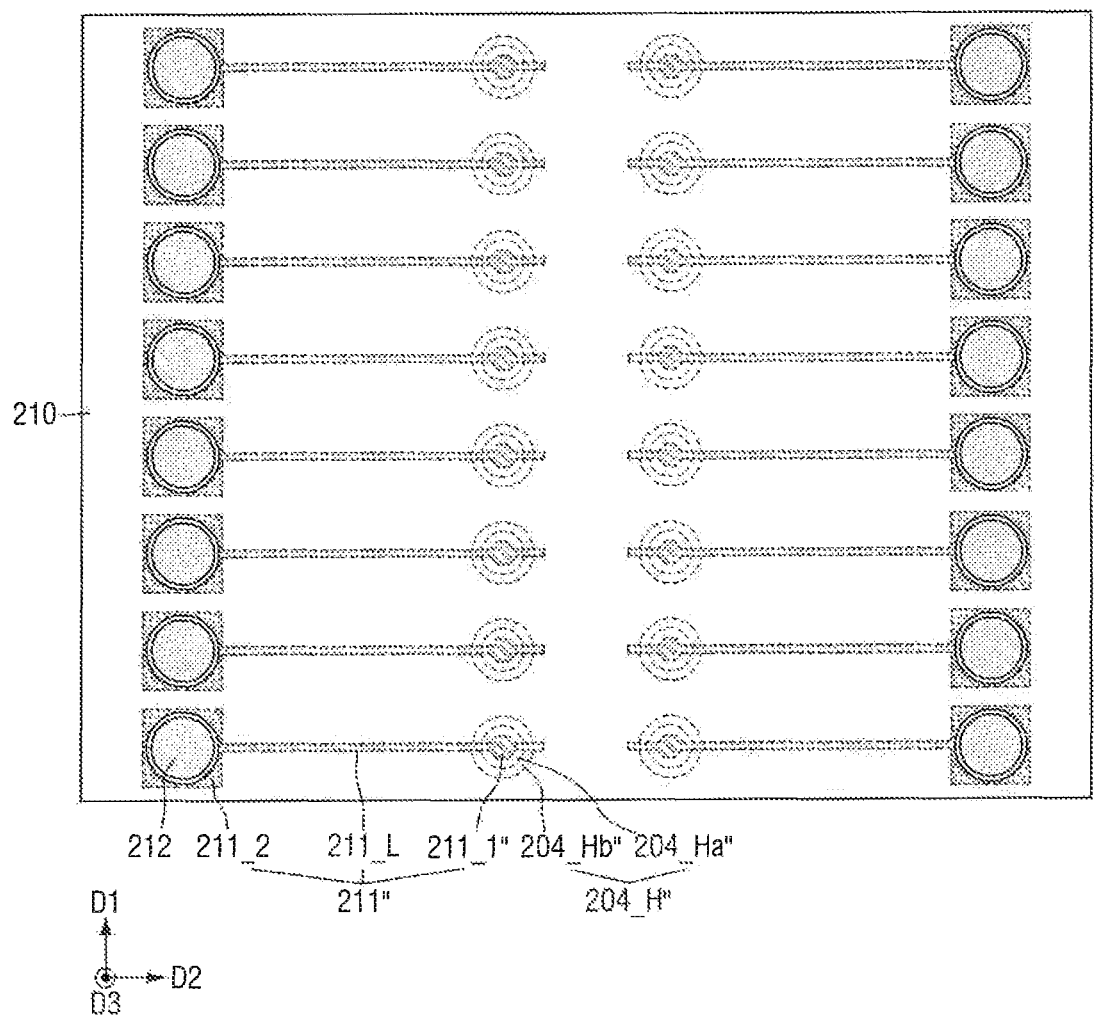
FIG. 20 is a plan view illustrating a semiconductor device according to an embodiment of the present disclosure.

FIG. 20 is a diagram for illustrating a semiconductor device 10" according to an embodiment of the present disclosure. For convenience of description, referring to FIG. 20, the following descriptions are based on differences thereof from those described in FIG. 1 to FIG. 4 and a repeated description of similar or identical elements may be omitted for convenience of explanation.

Referring to FIG. 20, the via hole 204_H in FIG. 1 to FIG. 4 and a via hole 204_H" in FIG. 20 correspond to each other. The redistribution conductive layer 211 in FIG. 1 to FIG. 4 and a redistribution conductive layer 211" in FIG. 20 correspond to each other.

The via hole 204_H" has a circular shape in a plan view, and a first pad area 211_1" of the redistribution conductive lay 211" has a circular shape in a plan view and is formed in the via hole 204_H".

Figure 21:
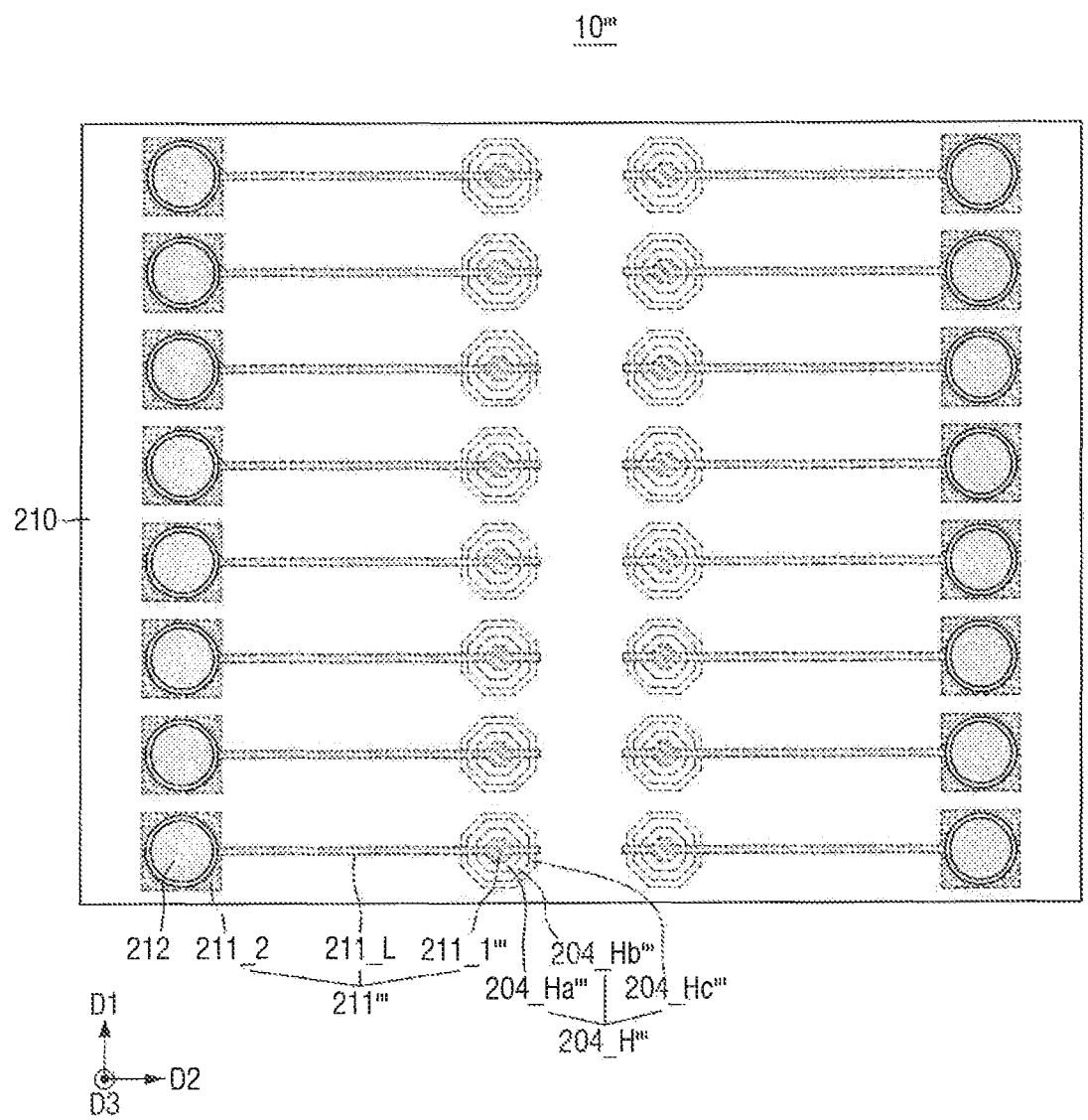
FIG. 21 is a plan view illustrating a semiconductor device according to an embodiment of the present disclosure.
Figure 22:
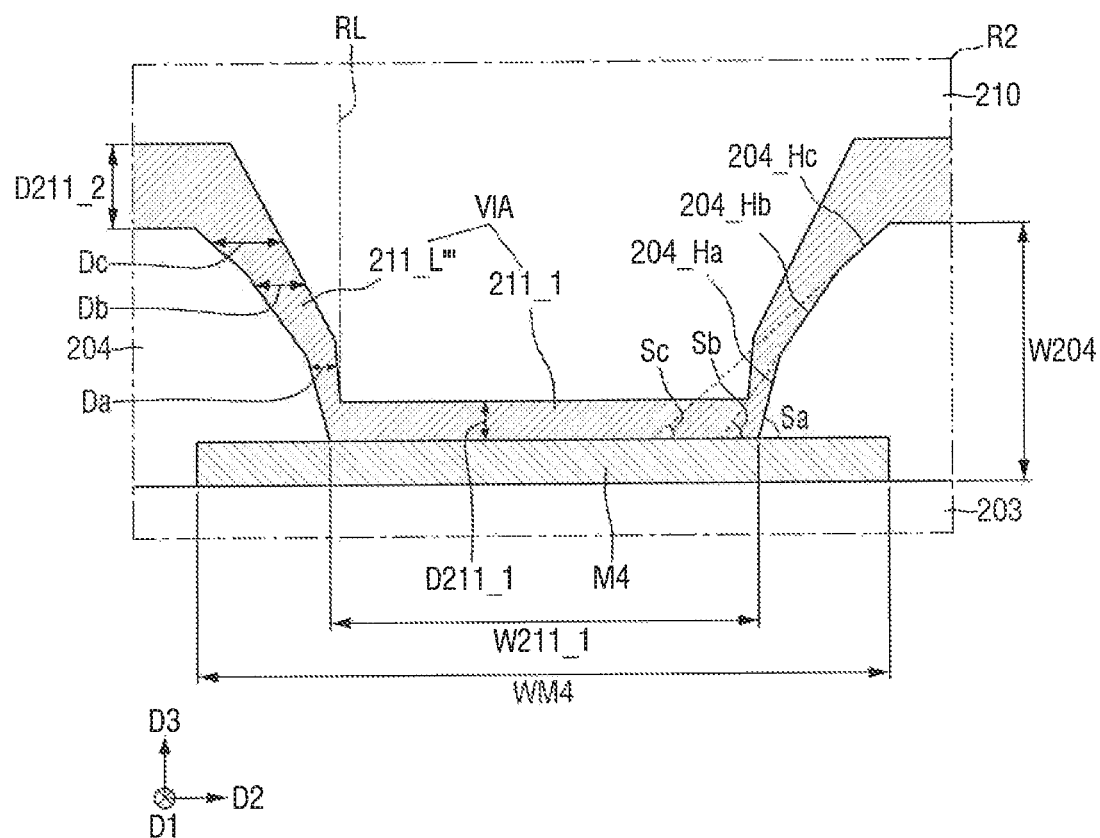
FIG. 22 is a cross-sectional view illustrating a semiconductor device according to an embodiment of the present disclosure.

FIG. 21 and FIG. 22 are diagrams for illustrating a semiconductor device according to some embodiments of the present disclosure. For convenience of description, referring to FIG. 21 and FIG. 22, the following descriptions are based on differences thereof from those described in FIG. 1 to FIG. 4 and a repeated description of similar or identical elements may be omitted for convenience of explanation.

The via hole 204_H in FIG. 1 to FIG. 4 and a via hole 204_H''' in FIG. 21 and FIG. 22 correspond to each other. The fourth conductive layer 211 in FIG. 1 to FIG. 4 and the fourth conductive layer 211''' in FIG. 21 and FIG. 22 correspond to each other.

When the via hole 204_H''' is compared with the via hole 204_H in FIG. 1 to FIG. 4, via hole 204_H''' further has a third face 204_Hc located at a higher level (e.g., distance from the substrate 100 in the third direction D3) than that of the second face 204_Hb, and having a third slope Sc that is less than the second slope Sb relative to the top face of the fourth conductive layer M4.

The third face 204_Hc may be inclined with respect to the third direction D3. The third face 204_Hc may be directly connected to and may directly contact the second face 204_Hb, and extends in the third slope Sc relative to the top face of the fourth conductive layer M4. In an embodiment, the third slope Sc is less than the second slope Sb relative to the top face of the fourth conductive layer M4. Therefore, the first slope Sa is larger than the second slope Sb which is larger than the third slope Sb. Thus, the via hole structure may increase the step coverage of the line area 211_L''' of the redistribution conductive layer 211'''.

Therefore, the line area 211_L''' of the redistribution conductive layer 211''' extends along the first to third faces 204_Ha to 204_Hc. A third thickness Dc in the second direction D2 of a portion of the line area 211_L''' on the third face 204_Hc is larger than a second thickness Db in the second direction D2 of a portion of the line area 211_L''' on the second face 204_Hb. The second thickness Db in the second direction D2 of the portion of the line area 211_L''' on the second face 204_Hb is larger than a first thickness Da in the second direction D2 of a portion of the line area 211_L''' on the first face 204_Ha.

Figure 23:
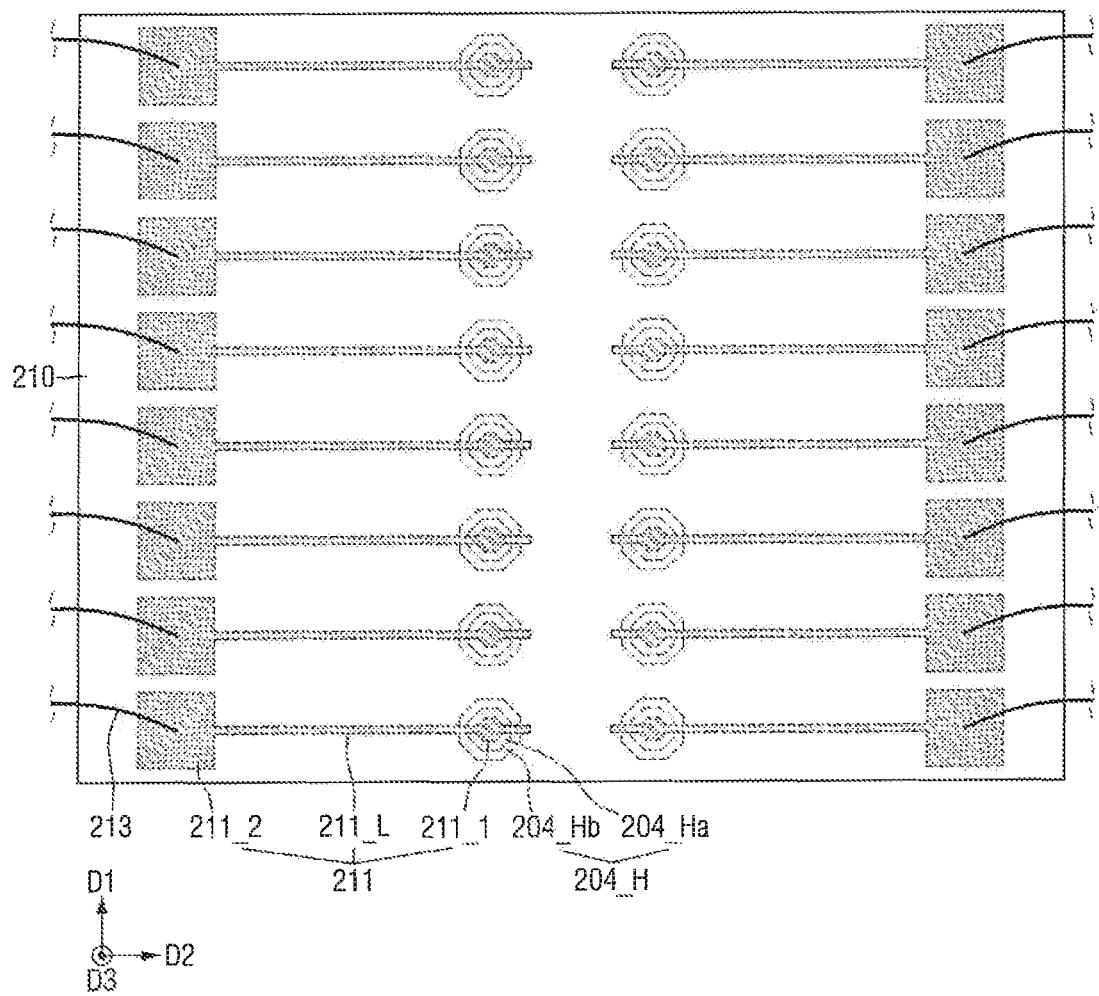
FIG. 23 is a plan view illustrating a semiconductor device according to an embodiment of the present disclosure.

FIG. 23 is a diagram for illustrating a semiconductor device 10'''' according to an embodiment of the present disclosure. The following descriptions will be based on differences thereof from those of the semiconductor device 10 in FIG. 1 to FIG. 4 and a repeated description of similar or identical elements may be omitted for convenience of explanation.

The semiconductor device 10'''' includes a wire 213 instead of the redistribution bump 212 shown in FIG. 1 to FIG. 4. The wire 213 and the second pad area 211_2 are electrically connected to the fourth conductive layer M4 via the redistribution conductive layer 211.

Figure 24:
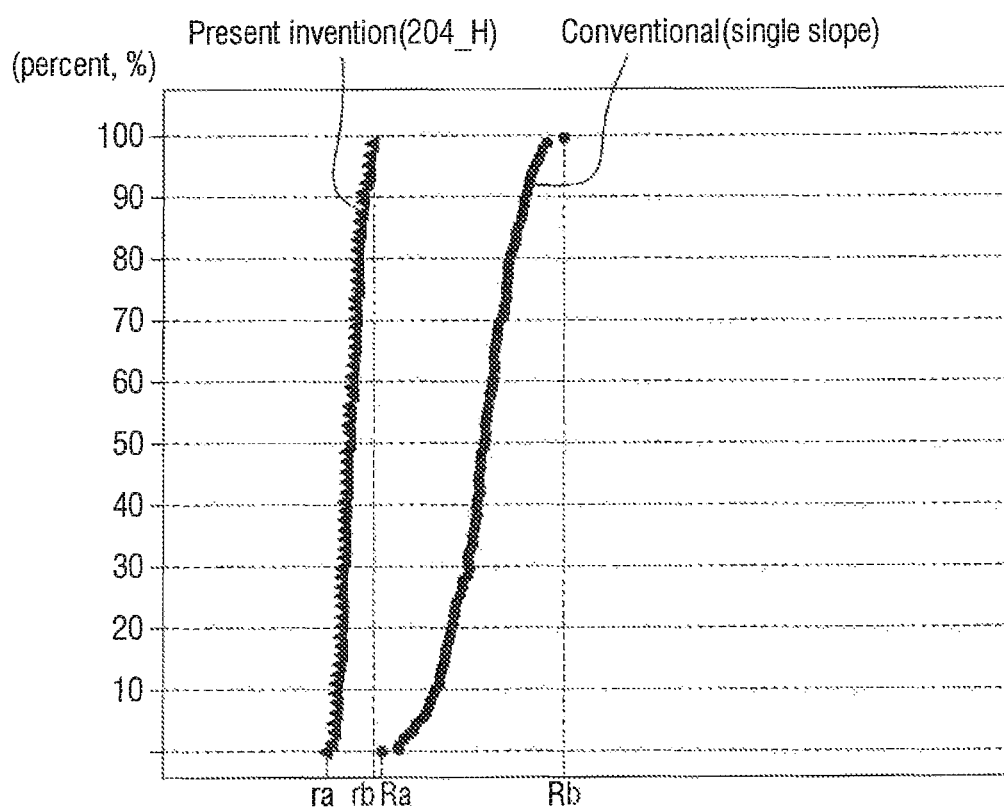
FIG. 24 is a graph for illustrating an effect of a semiconductor device according to an embodiment of the present disclosure.

FIG. 24 is a graph for illustrating an effect of a semiconductor device according to an embodiment of the present disclosure.

A vertical axis of the graph of FIG. 24 may mean a vertical level of a sample as each of two via structures (Present Invention and Conventional) having the same pad area size. A horizontal axis thereof represents a resistance value of the sample based on the vertical level.

The via structure (Present Invention) includes a via hole such as the via hole 204_H according to an embodiment of the present disclosure and has a multi-slope structure and has a resistance in a range of ra to rb.

A minimum resistance value of the via structure having a single-slope structure (Conventional) is Ra which is greater than a maximum resistance value rb of the via structure (Present Invention) having the multi-slope structure. A maximum resistance value of the via structure having the single-slope structure is Rb.

Accordingly, resistance-related efficiency of the via structure having the via hole such as the via hole 204_H according to an embodiment of the present disclosure and thus having the multi-slope structure is increased.

In addition, a thickness of a sidewall profile of the via structure with the multi-slope structure may be uniform, thereby preventing failure due to a hole in the sidewall area 211_L'.

Since the via hole 204_H does not have a multi-step structure, residues or by-products (e.g., polymer) from a process do not remain between the first face 204_Ha and the second face 204_Hb of the via hole 204_H, so that durability of the semiconductor device may be increased.

Further, in the method for manufacturing the semiconductor device according to some embodiments of the present disclosure, as in the description of FIG. 7 to FIG. 9, the plurality of parasitic patterns R/T1 to R/T3 adjacent to the main pattern MP may be formed in the mask pattern Mask to form the via hole 204_H and the sidewall area 211_L' of the line area. 211_L without adding a separate process such that the step coverage of the redistribution layer may be increased.

Although embodiments of the present disclosure have been described with reference to the accompanying drawings, it will be apparent to those skilled in the art that the present disclosure can be manufactured in various forms without being limited to the above-described embodiments and may be embodied in other specific forms without departing from the technical spirits and essential characteristics of the present disclosure. Thus, the above embodiments are to be considered in all respects as illustrative and not restrictive.

What is claimed is:

1. A semiconductor device comprising:
   a substrate;
   a conductive layer disposed on the substrate and extending in a first direction;
   an insulating layer disposed on the conductive layer and exposing at least a portion of the conductive layer through a via hole defined therein, wherein the via hole includes:
      a first face extending in a first slope relative to a top face of the conductive layer; and
      a second face extending in a second slope relative to the top face of the conductive layer, the second slope is less than the first slope; and
   a redistribution conductive layer including:
      a first pad area disposed in the via hole; and
      a line area at least partially extending along the first face and the second face,
   wherein the first face directly contacts the conductive layer, and the second face is positioned at a level higher than a level of the first face in a second direction perpendicular to a top face of the substrate.

2. The device of claim 1, wherein the line area extends in a slope that is less than a slope of the second direction.

3. The device of claim 1, wherein the first slope is in a range of 60° to 90°.

4. The device of claim 3, wherein the via hole further includes a third face positioned at a level higher than the level of the second face in the second direction, wherein the third face extends in a third slope relative to the top face of the conductive layer, the third slope is less than the second slope.

5. The device of claim 3, wherein a first thickness in a third direction of a portion of the line area disposed on the first face is less than a second thickness in the third direction of a portion of the line area disposed on the second face, wherein the third direction intersects the first direction.

6. The device of claim 5, wherein the first thickness is in a range of 0.3 um to 3 um,
   wherein the second thickness is in a range of 0.3 um to 1.0 um.

7. The device of claim 1, wherein the insulating layer has a thickness in the second direction in a range of 2 um to 10 um.

8. The device of claim 1, wherein the redistribution conductive layer further includes:
   a second pad area disposed on a top face of the insulating layer; and
   a passivation layer covering the redistribution conductive layer and exposing at least a portion of the second pad area.

9. The device of claim 8, wherein the device further comprises a redistribution bump disposed on the at least the portion of the second pad area exposed by the passivation layer,
wherein the redistribution conductive layer electrically connects the redistribution bump and the second pad area to the conductive layer.

10. The device of claim 1, wherein the redistribution conductive layer includes aluminum (Al).

11. A semiconductor device comprising:
a substrate;
a conductive layer disposed on the substrate and extending in a first direction;
an insulating layer disposed on the conductive layer and exposing at least a portion of the conductive layer through a via hole defined therein, wherein the via hole includes:
a first face extending in a first slope relative to a top face of the conductive layer; and
a second face extending in a second slope relative to the top face of the conductive layer, the second slope is less than the first slope; and
a redistribution conductive layer including:
a first pad area disposed in the via hole; and
a line area at least partially extending along the first face and the second face,
wherein the line area extends in a slope that is less than a slope of a second direction perpendicular to a top face of the substrate.

12. The device of claim 11, Wherein the first face directly contacts the conductive layer, and the second face is positioned at a level higher than a level of the first face in the second direction.

13. The device of claim 11, wherein the insulating layer has a thickness in the second direction in a range of 2 um to 10 um.

14. The device of claim 11, wherein the line area does not extend inwardly towards the first pad area beyond a limit line extending from an outer edge of the first pad area in the second direction.

15. A method for manufacturing a semiconductor device, the method comprising:
providing a substrate;
forming a conductive layer on the substrate;
forming an insulating layer on the conductive layer;
forming a photoresist layer on the insulating layer;
exposing the photoresist layer to light using a mask including a pattern group and developing the exposed photoresist layer to form a photoresist hole pattern;
etching the insulating layer using the photoresist hole pattern as an etching mask to form a via hole defined in the insulating layer, the via hole exposing at least a portion of the conductive layer; and
forming a redistribution conductive layer that includes a first pad area disposed in the via hole and a line area that at least partially extends along a sidewall of the via hole,
wherein the pattern group includes:
a main pattern having a same planar shape as a planar shape of the via hole; and
a plurality of parasitic patterns arranged sequentially and outwardly to surround the main pattern, wherein each of the plurality of parasitic patterns has a closed ring shape in a plan view.

16. The method of claim 15, wherein the via hole has:
a first face extending in a first slope relative to a top face of the conductive layer; and
a second face extending in a second slope relative to the top face of the conductive layer, the second slope is less than the first slope,
wherein the line area at least partially extends along the first and second faces of the via hole,
wherein the first slope is in a range of 60° to 90°.

17. The method of claim 16, wherein the first face directly contacts the conductive layer, and the second face is positioned at a level higher than a level of the first face in a second direction perpendicular to a top face of the substrate.

18. The method of claim 15, wherein the plurality of parasitic patterns includes:
a first parasitic pattern disposed directly adjacent to the main pattern and surrounding the main pattern; and
a second parasitic pattern spaced apart from the first parasitic pattern and surrounding the main pattern and the first parasitic pattern.

19. The method of claim 18, wherein in a plan view, a width of the first parasitic pattern is less than a width of the second parasitic pattern.

20. The method of claim 15, wherein the redistribution conductive layer is formed using at least one process selected from a physical vapor deposition (PVD) process or an aluminum reflow process including a physical vapor deposition.

* * * * *